US012616021B2

(12) United States Patent
Lin et al.

(10) Patent No.: US 12,616,021 B2
(45) Date of Patent: Apr. 28, 2026

(54) METAL INSULATOR METAL (MIM) CAPACITOR ARCHITECTURES

(71) Applicant: Intel Corporation, Santa Clara, CA (US)

(72) Inventors: Chia-Ching Lin, Portland, OR (US); Sou-Chi Chang, Portland, OR (US); Kaan Oguz, Portland, OR (US); Arnab Sen Gupta, Hillsboro, OR (US); I-Cheng Tung, Hillsboro, OR (US); Matthew V. Metz, Portland, OR (US); Sudarat Lee, Hillsboro, OR (US); Scott B. Clendenning, Portland, OR (US); Uygar E. Avci, Portland, OR (US); Aaron J. Welsh, Portland, OR (US)

(73) Assignee: Intel Corpoation, Santa Clara, CA (US)

( * ) Notice: Subject to any disclaimer, the term of this patent is extended or adjusted under 35 U.S.C. 154(b) by 239 days.

(21) Appl. No.: 18/129,264

(22) Filed: Mar. 31, 2023

(65) Prior Publication Data

US 2023/0411278 A1     Dec. 21, 2023

Related U.S. Application Data

(60) Provisional application No. 63/352,904, filed on Jun. 16, 2022.

(51) Int. Cl.
H01L 23/522      (2006.01)
H10D 1/00       (2025.01)
(Continued)

(52) U.S. Cl.
CPC ......... *H01L 23/5223* (2013.01); *H10D 1/042* (2025.01); *H10D 1/696* (2025.01); *H10D 1/716* (2025.01); *H10D 84/212* (2025.01)

(58) Field of Classification Search
CPC .... H01L 23/5223; H10D 1/042; H10D 1/696; H10D 1/716; H10D 84/212
See application file for complete search history.

(56) References Cited

U.S. PATENT DOCUMENTS

2003/0060042 A1     3/2003  Park
2017/0148868 A1     5/2017  Lindert
(Continued)

FOREIGN PATENT DOCUMENTS

JP          2012124254        6/2012

OTHER PUBLICATIONS

Extended European Search Report for European Patent No. 23173771.9 mailed Nov. 2, 2023, 6 pgs.
(Continued)

*Primary Examiner* — Samuel A Gebremariam
(74) *Attorney, Agent, or Firm* — Schwabe, Williamson & Wyatt P.C.

(57) ABSTRACT

Metal insulator metal capacitors are described. In an example, a metal-insulator-metal (MIM) capacitor includes a first electrode that includes a bottom region and a pair of vertical regions. First metal layers are outside the vertical regions and in contact with the vertical regions. An insulator is over the first electrode. A second electrode is over the insulator. A second metal layer is on a top surface of the second electrode.

20 Claims, 32 Drawing Sheets

(51) Int. Cl.
   *H10D 1/68*     (2025.01)
   *H10D 84/00*    (2025.01)

(56)               References Cited

U.S. PATENT DOCUMENTS

| | | | |
|---|---|---|---|
| 2018/0197946 A1 | 7/2018 | Leobandung | |
| 2020/0194435 A1* | 6/2020 | Lilak | H10D 30/6735 |
| 2021/0098373 A1 | 4/2021 | Lajoie | |
| 2022/0052151 A1* | 2/2022 | Wang | H10D 1/696 |
| 2022/0336576 A1 | 10/2022 | Hsiao | |

OTHER PUBLICATIONS

Extended European Search Report for European Patent No. 23172238.0 mailed Nov. 2, 2023, 6 pgs.

Office Action from U.S. Appl. No. 18/129,258, mailed Aug. 28, 2025, 12 pgs.

* cited by examiner

900

910

1100

1106    1104

1112

1102

1108

1110

MIM Enhancement
Ratio

● 0.5x

△ 1.0x

▼ 2.4x

☐ 3.4x

METAL INSULATOR METAL (MIM) CAPACITOR ARCHITECTURES

CROSS-REFERENCE TO RELATED APPLICATIONS

This application claims the benefit of U.S. Provisional Application No. 63/352,904, entitled "METAL INSULATOR METAL (MIM) CAPACITOR ARCHITECTURES," filed on Jun. 16, 2022, the entire contents of which are hereby incorporated by reference herein.

TECHNICAL FIELD

Embodiments of the disclosure are in the field of advanced integrated circuit structure fabrication and, in particular, metal insulator metal (MIM) capacitors.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into smaller and smaller nodes. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
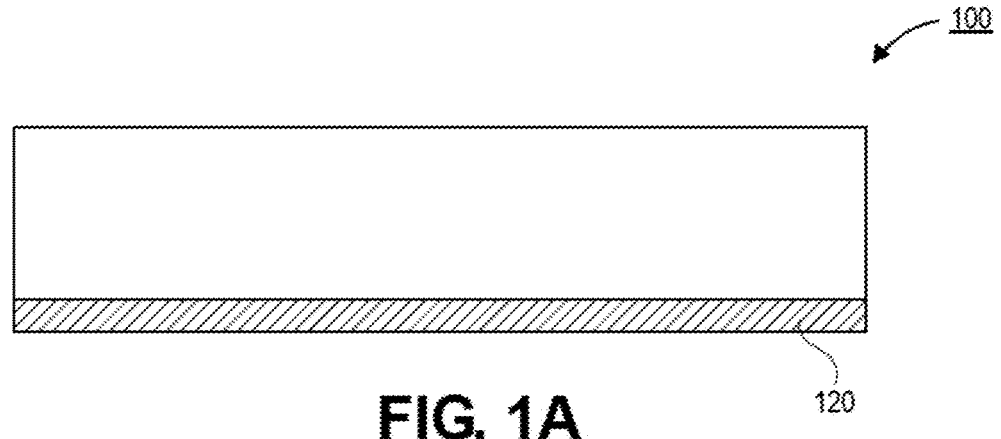
FIG. 1A is a cross-sectional illustration of a die with a capacitor region in the back-end-of-line (BEOL) stack, in accordance with an embodiment of the present disclosure.

Metal insulator metal (MIM) capacitors are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In accordance with one or more embodiments of the present disclosure, a metal insulator metal (MIM) capacitor is described. One or more embodiments are directed to metal insulator metal (MIM) capacitor architectures in the back-end-of-line (BEOL) stack of a die. Embodiments can be implemented to increase capacitance of a MIM capacitor while meeting reliability specifications.

To provide context, MIM capacitors generally include a bottom electrode, an insulator over the bottom electrode, and a top electrode over the insulator. In an effort to increase the density of the capacitors, deep trench architectures have been proposed. While increasing the capacitance density, such architectures are particularly prone to high RC values.

This is due in part to the need to plate extremely thin electrodes in order to fit the electrodes (and insulator) in the deep trenches. Accordingly, deep trench architectures are currently not as effective as possible.

As noted above, MIM capacitors may be fabricated with deep trench architectures in order to increase the capacitor density in the BEOL stack. However, existing MIM capacitors may be susceptible to high RC values due to thin electrodes. The thin electrodes increase the capacitance of the structures, which negatively affects the performance of the MIM capacitors. Accordingly, embodiments disclosed herein include MIM capacitors that include bottom and top electrodes that are increased in thickness. The thickness increase may be enabled by using both atomic layer deposition (ALD) and physical vapor deposition (PVD) processes in combination with each other. The increased thickness allows for the resistance along the MIM capacitors to be reduced and overall performance is improved.

In other embodiments, the capacitance density is further improved by use of novel material systems. For example, a titanium oxide insulator layer may be used. Titanium oxide insulating layers may have a dielectric constant (i.e., k-value) that is two to four times higher than hafnium-based insulator layers. The increase in capacitance density enables a voltage reduction that leads to improved CMOS performance.

In yet another embodiment, stacked MIM capacitors are provided. In stacked MIM capacitors one of the bias polarities has a reliability issue. This prevents $SrTiO_3$ (STO) decoupling capacitors in multi-plate architectures to be used at advanced technology nodes. Accordingly, embodiments include a stack of STO capacitors that further includes a hafnium based insulator (e.g., $HfAlO_2$) that is provided in the stack. The hafnium based capacitor may be provided between a nominal voltage STO capacitor and a high voltage STO capacitor in order to account for the bias polarity reliability issue.

Another issue that may arise with STO capacitors is that the dielectric constant increases as the atomic percentages approach the stoichiometric value, but so does the leakage. In contrast, Sr rich material systems include lower dielectric constants, but have much improved leakage values. Accordingly, embodiments disclosed herein include a bi-layer approach. A first thin layer is provided with a Sr rich material, and a thicker second layer is provided with stoichiometric STO.

To provide further context, higher on-die MIM (metal-insulator-metal) capacitance density is needed to minimize first droop during load switching. On-die MIM is located between the two top metal layers so this is a backend decouple capacitance and the process temperature needs to be at or lower than 400 C. The de-coupling capacitor by using deep trench structure can improve charge density a lot without changing the high-k material. However, the RC is a concern. Embodiments described herein can be implemented to solve the RC issue, e.g., by reducing RC by 100×.

Advantages of implementing embodiments described herein can include promoting higher dielectric constants and higher breakdown voltages and large charge storage in the MIM capacitors. Higher capacitance MIM structures compensate for droops in power delivery and buffer external electrical noise sources. The result is lower Vmin for the transistor, which can be utilized to operate at substantially higher operational frequencies and/or at lower power.

In a first aspect, deep-trench architectures with ultra-low resistance for on-die decoupling capacitors are described.

Referring now to FIG. 1A, a cross-sectional illustration of a die 100 is shown, in accordance with an embodiment of the present disclosure. The top side of the die 100 may include transistors and the like (not shown). On the backside of the die 100, a capacitor region 120 is provided. The capacitor region 120 may be provided in the BEOL stack of the die 100. Typically, the capacitors of the capacitor region 120 are provided in the last routing layers of the BEOL stack. The capacitor region 120 is shown as a generic block in FIG. 1A, however, it is to be appreciated that the capacitor architectures within the capacitor region 120 may include any capacitor structure such as those described in greater detail herein. For example, the capacitor region 120 may include deep trench capacitor architectures or stacked plate capacitor architectures. In a particular embodiment, the capacitor region 120 may include STO-based capacitors.

Figure 1B:
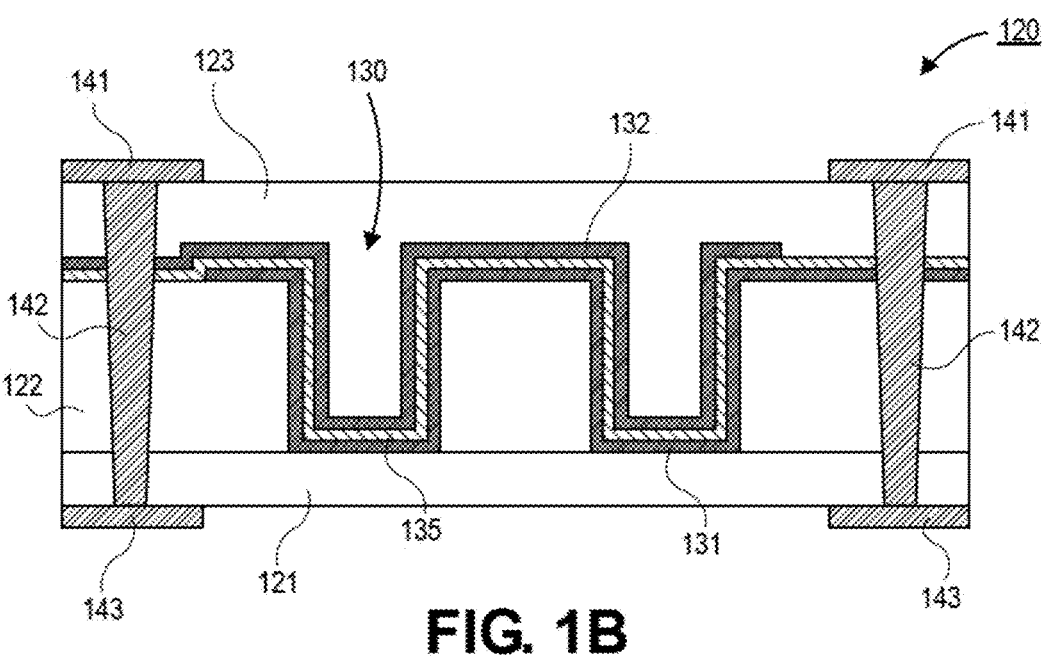
FIG. 1B is a cross-sectional illustration of a deep trench capacitor architecture, in accordance with an embodiment of the present disclosure.

Referring now to FIG. 1B, a cross-sectional illustration of a capacitor region 120 is shown, in accordance with an embodiment of the present disclosure. In an embodiment, the capacitor region 120 may be fabricated in one or more buildup layers 121, 122, and 123. The capacitor region 120 may include a plurality of deep trench capacitors. Each deep trench capacitor is provided in a trench 130 formed into the buildup layer 122. The capacitor itself may include a first electrode 131, an insulating layer 135, and a second electrode 132. The first electrode 131, the insulating layer 135, and the second electrode 132 may line the trench 130 and have U-shaped cross-sections. The individual capacitors may be coupled together by layers over a top surface of the buildup layer 122. Additionally, the second electrode 132 may be contacted by a via 142 (i.e., left via 142) that is provided between pads 141 and 143. The first electrode 131 may be contacted by a via 142 (i.e., right via 142) that is provided between pads 141 and 143.

In the illustrated embodiment, a pair of trenches 130 are shown for simplicity. However, it is to be appreciated that tens, hundreds, or thousands, of trenches 130 may be provided in the capacitor region 120. For example, the trenches 130 may occupy an area that is approximately 50 µm by 50 µm or larger in some embodiments.

As shown, the thickness of the first electrode 131, the insulating layer 135, and the second electrode 132 need to be thin in order to fit into the deep trench 130. For example, the layers 131, 135, and 132 may be formed with ALD processes or other conformal deposition process. Particularly, the width of the trench 130 may be 100 nm or smaller. As capacitor density is increased, the trench 130 width is decreased, and limits the thicknesses of layers 131, 135, and 132. Thin thicknesses of the electrodes 131 and 132 results in a higher resistance for the capacitor and decreases performance.

In an embodiment, an ALD high-k dielectric stack includes $SrTiO_3$, $BaTiO_3$, $BaHfO_3$, $BaZrO_3$, $LaAlO_3$, $LaCoO_3$, $SrSnO_3$ or combinations thereof. In an embodiment, ALD conductive layer/electrodes to enable high AR deposition can include (1) ALD Ru, $RuO_2$, $IrO_2$, Mo, $MoO_2$, Rh, Re, W, or Pt, or (2) ALD $ABX_3$ perovskite complex oxides, e.g. $LaNiO_3$, $LaRuO_3$, $SrVO_3$, $SrCoO_3$, $SrMoO_3$, or $SrRuO_3$ to enable high quality metal-insulator interface.

Figure 2:
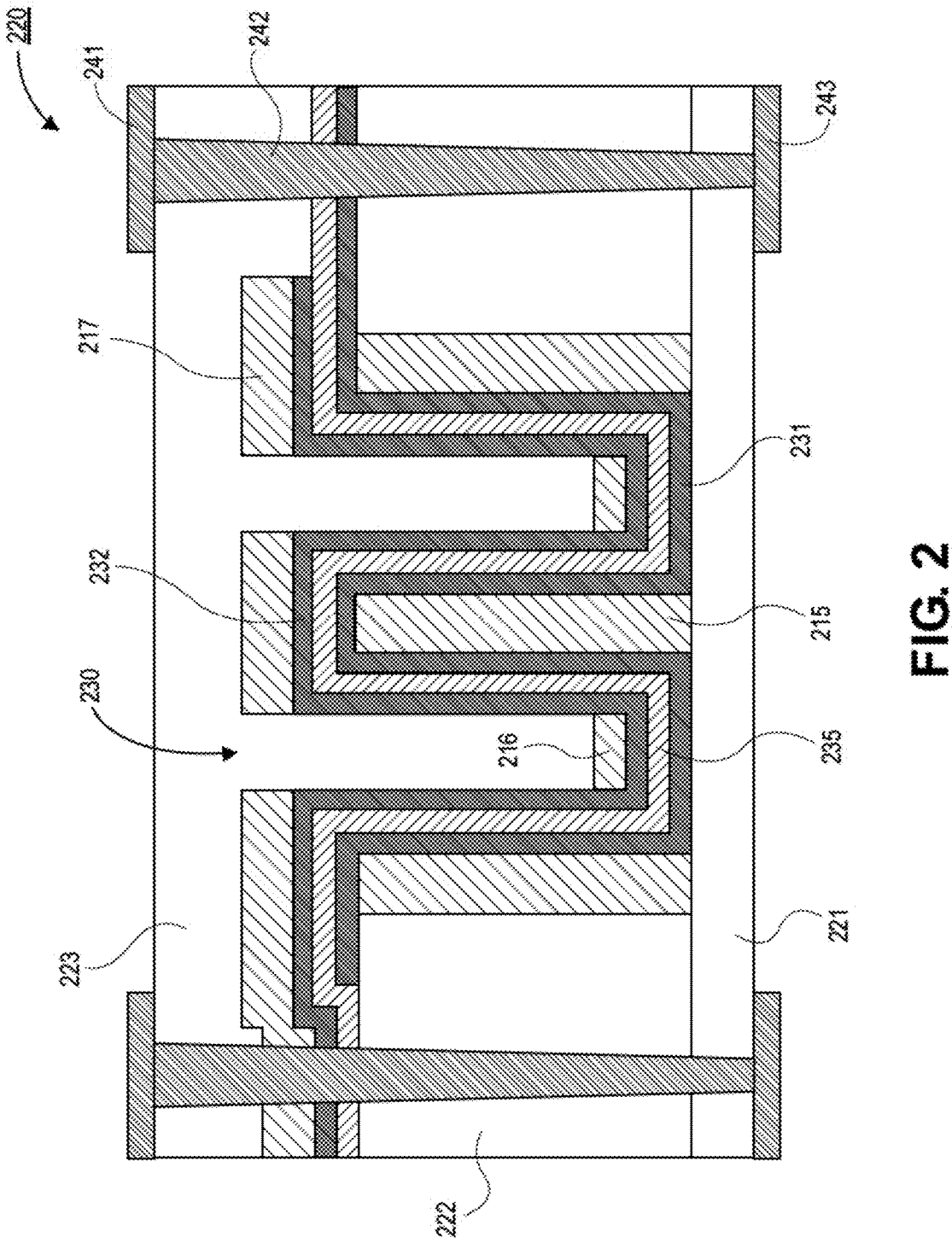
FIG. 2 is a cross-sectional illustration of a deep trench capacitor with thickened top and bottom electrodes, in accordance with an embodiment of the present disclosure.

Accordingly, a first embodiment, shown in FIG. 2 includes a capacitor region 220 that includes capacitors with improved resistance values. The capacitor region 220 may be formed in one or more buildup layers 221, 222, and 223. A first electrode 231 may be contacted by a first via 242 (i.e., the right via 242) that is between pads 241 and 243, and a second electrode 232 may be contacted by a second via 242

(i.e., the left via 242). An insulator 235 may be provided between the first electrode 231 and the second electrode 232.

Metal layers 215, 216, and 217 are used to increase the thickness of the electrodes 231 and 232. Particularly, metal layers 215 may be provided along vertical portions of the first electrode 231, metal layers 216 may be provided on the second electrode 232, and metal layers 217 may also be provided on the second electrode 232. The metal layers 215, 216, and 217 may be a different material than the first electrode 231 and the second electrode 232. In other embodiments, one or more of the metal layers 215, 216, and 217 may be the same material as one or both of the first electrode 231 and the second electrode 232. When the metal layers 215, 216, or 217 are the same material as the first electrode 231 or the second electrode 232, there may not be a discernable difference between the two layers. However, evidence of the extra metal layer will be provided because the thickness of the first electrode 231 or the second electrode 232 will be greater than in other areas of the capacitor region 220.

Referring now to FIGS. 3A-3J, a series of cross-sectional illustrations depicting a process for forming a capacitor region 320 similar to the capacitor shown in FIG. 2 is shown, in accordance with an embodiment of the present disclosure.

Figure 3A:
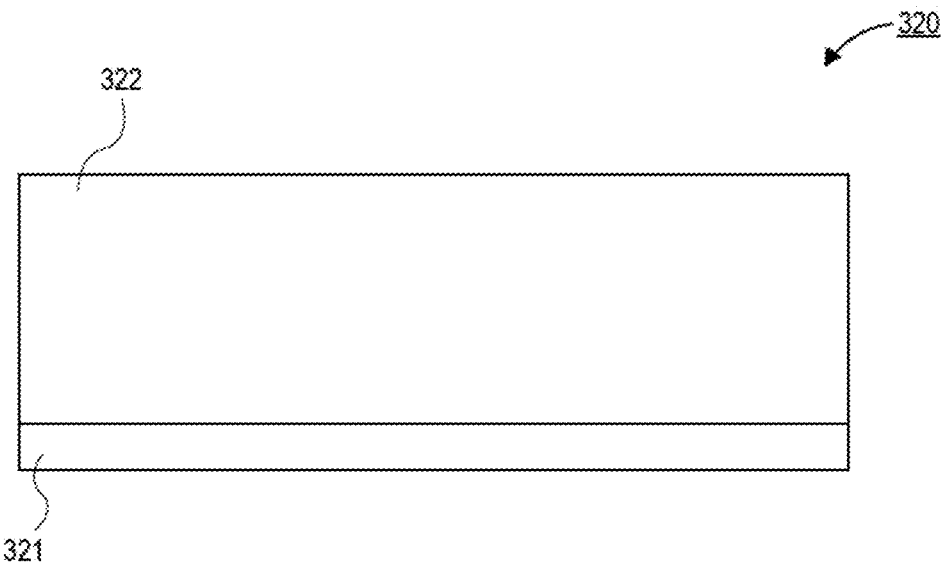
FIGS. 3A-3J are cross-sectional illustrations depicting a process for forming a deep trench capacitor with thickened top and bottom electrodes, in accordance with an embodiment of the present disclosure.

Referring ow to FIG. 3A, a cross-sectional illustration of the capacitor region 320 at a stage of manufacture is shown, in accordance with an embodiment of the present disclosure. As shown, the capacitor region 320 includes a first buildup layer 321 and a second buildup layer 322.

Figure 3B:
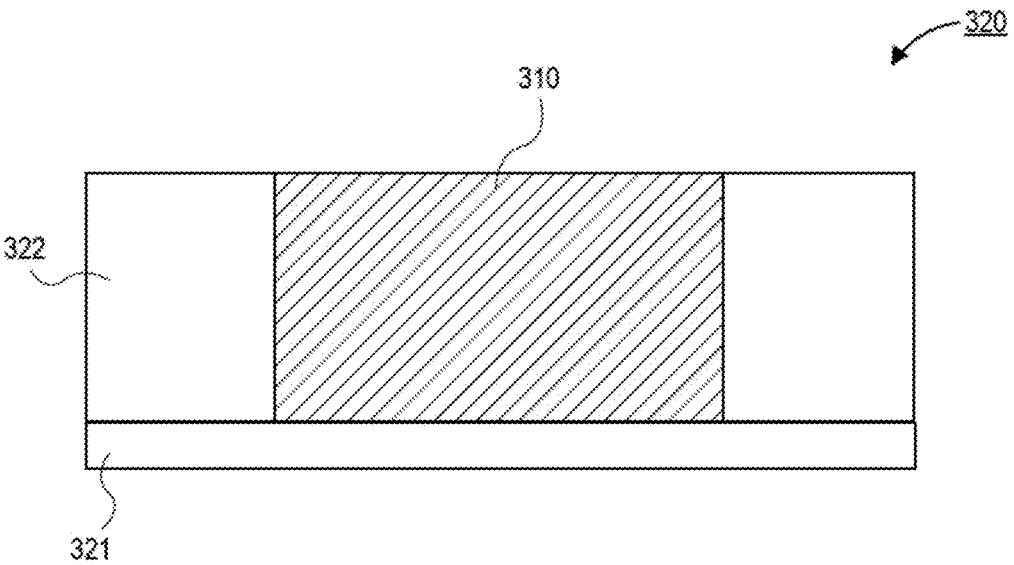

Referring now to FIG. 3B, a cross-sectional illustration of the capacitor region 320 after a metal plug 310 is deposited into the second buildup layer 322 is shown, in accordance with an embodiment of the present disclosure. The metal plug 310 may be formed by first etching a cavity into the second buildup layer 322 and filling the cavity with the metal of the metal plug 310. The metal plug 310 may be formed with any suitable metal deposition process, such as PVD, chemical vapor deposition (CVD), or the like.

Figure 3C:
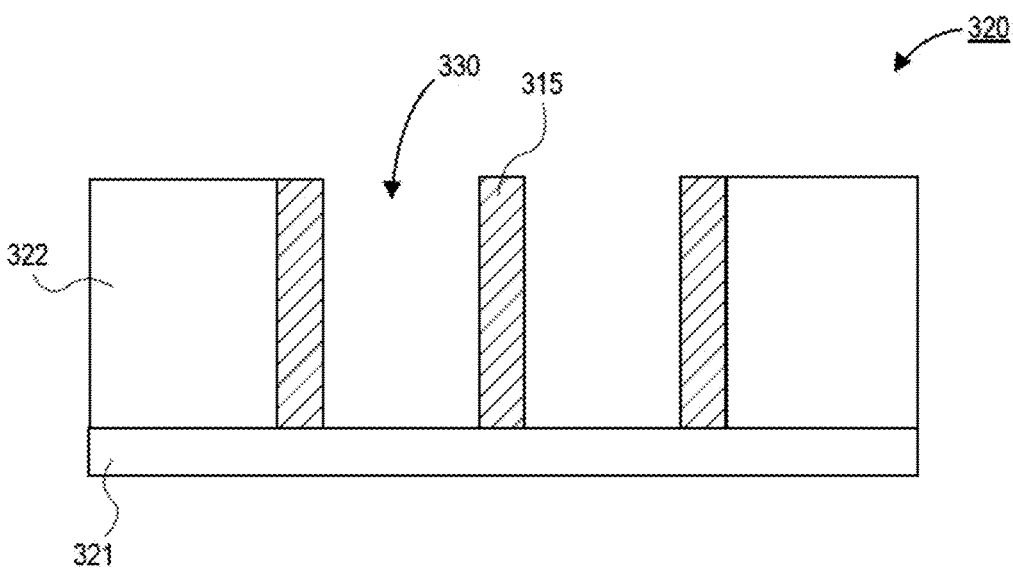

Referring now to FIG. 3C, a cross-sectional illustration of the capacitor region 320 after trenches 330 are formed into the metal plug 310 is shown, in accordance with an embodiment of the present disclosure. In an embodiment, the trenches 330 may be formed with an etching process. The residual portions of the metal plug 310 may be referred to as first metal layers 315. The width of the trenches 330 may be approximately 100 nm or less. In the illustrated embodiment, a pair of trenches 330 are shown. However, it is to be appreciated that tens, hundreds, or thousands of trenches may be included in the capacitor region 320.

Figure 3D:
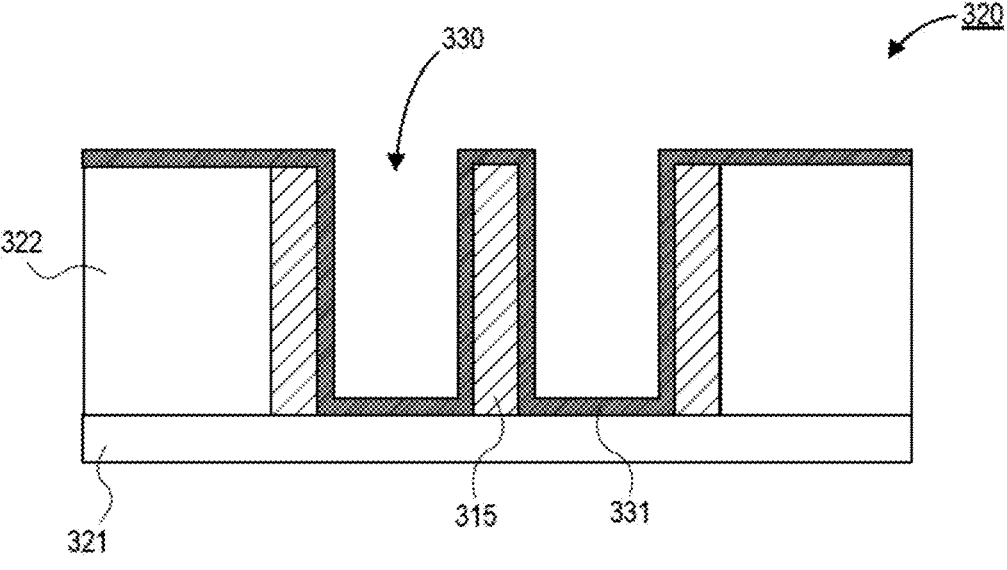

Referring now to FIG. 3D, a cross-sectional illustration of the capacitor region 320 after a first electrode 331 is deposited is shown, in accordance with an embodiment of the present disclosure. In an embodiment, the first electrode 331 may be deposited with a conformal deposition process. For example, the first electrode 331 may be deposited with an ALD process. The first electrode 331 may line the exposed edges of the first metal layers 315, be provided over a top surface of the buildup layer 322, and be provided over the top surface of the buildup layer 321. In an embodiment, the first electrode 331 may be a different material than the first metal layers 315. In other embodiments, the first electrode 331 may be the same material as the first metal layers 315.

Figures 3E, 3F:
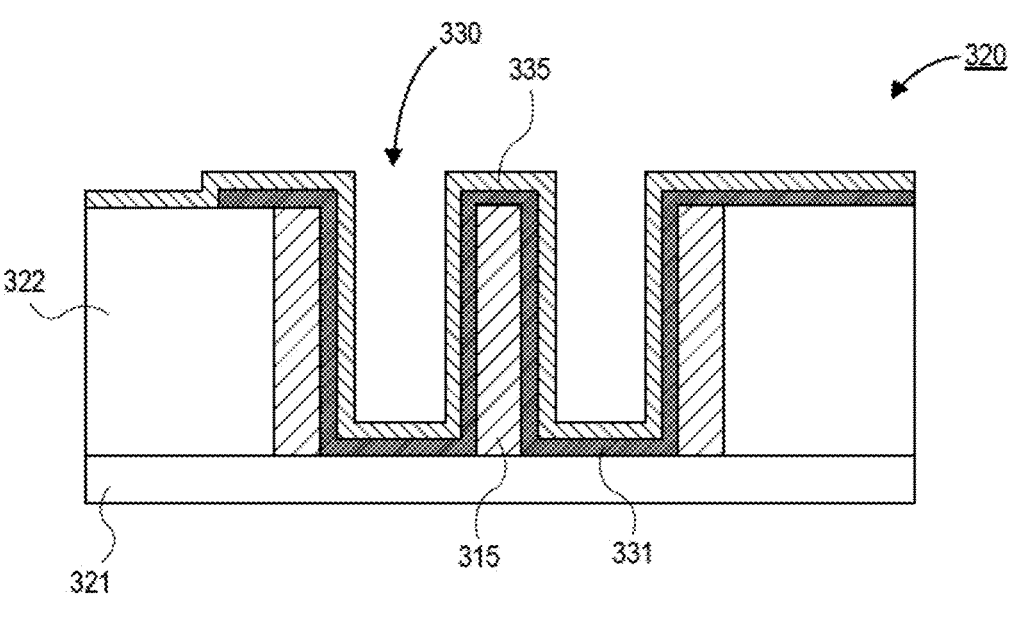

Referring now to FIG. 3E, a cross-sectional illustration of the capacitor region 320 after an insulating layer 335 is deposited is shown, in accordance with an embodiment of the present disclosure. In an embodiment, the insulating layer 335 may be deposited with a conformal deposition process, such as ALD or the like. In an embodiment, the insulating layer 335 may be any insulating layer with a high dielectric constant. For example, the insulating layer 335 may include an STO material system, though other insulating layer 335 material systems described in greater detail herein may also be used. Also shown in FIG. 3E, is that the left end of the first electrode 331 is etched back. This allows for the insulating layer 335 to contact the top surface of the buildup layer 322 in some embodiments.

Referring now to FIG. 3F, a cross-sectional illustration of the capacitor region 320 after a second electrode 332 is deposited is shown, in accordance with an embodiment of the present disclosure. In an embodiment, the second electrode 332 may be deposited with a conformal deposition process, such as ALD or the like. The second electrode 332 may be provided directly over the insulating layer 335. The second electrode 332 may have the same material composition as the first electrode 331 in some embodiments. In other embodiments, the second electrode 332 may be a different material than the first electrode 331.

Figure 3G:
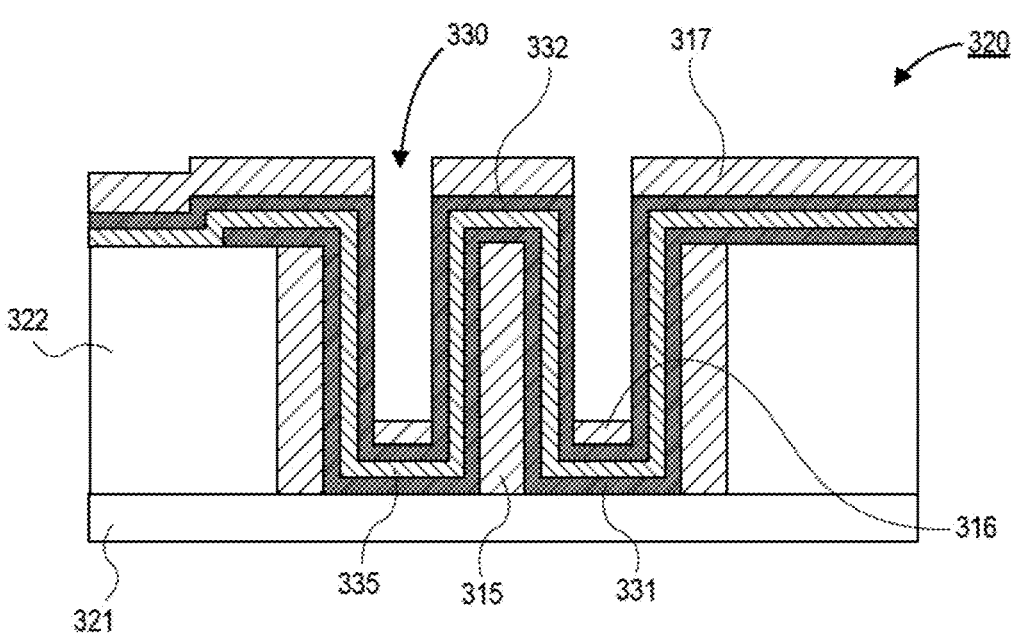

Referring now to FIG. 3G, a cross-sectional illustration of the capacitor region 320 after a second metal layer 316 and a third metal layer 317 are deposited is shown, in accordance with an embodiment of the present disclosure. In an embodiment, the second metal layer 316 and the third metal layer 317 may be deposited with a non-conformal deposition process, such as PVD or the like. Since the deposition process is non-conformal, the sidewalls of the trench 330 (i.e., the sidewalls of the second electrode 332) are not covered. Instead, the second metal layer 316 is provided at the bottom of the trench 330, and the third metal layer 317 is provided over a top surface of the structure (i.e., over top surfaces of the second electrode 332). The second metal layer 316 and the third metal layer 317 increase the effective thickness of the second electrode 332 and results in a decrease in the resistance of the capacitor.

In an embodiment, a thickness of the second metal layer 316 may be smaller than a thickness of the third metal layer 317. The second metal layers 316 and the third metal layers 317 may be a material that is different than the second electrode 332. In other embodiments, the second metal layers 316 and the third metal layers 317 may be the same material as the second electrode 332.

Figure 3H:
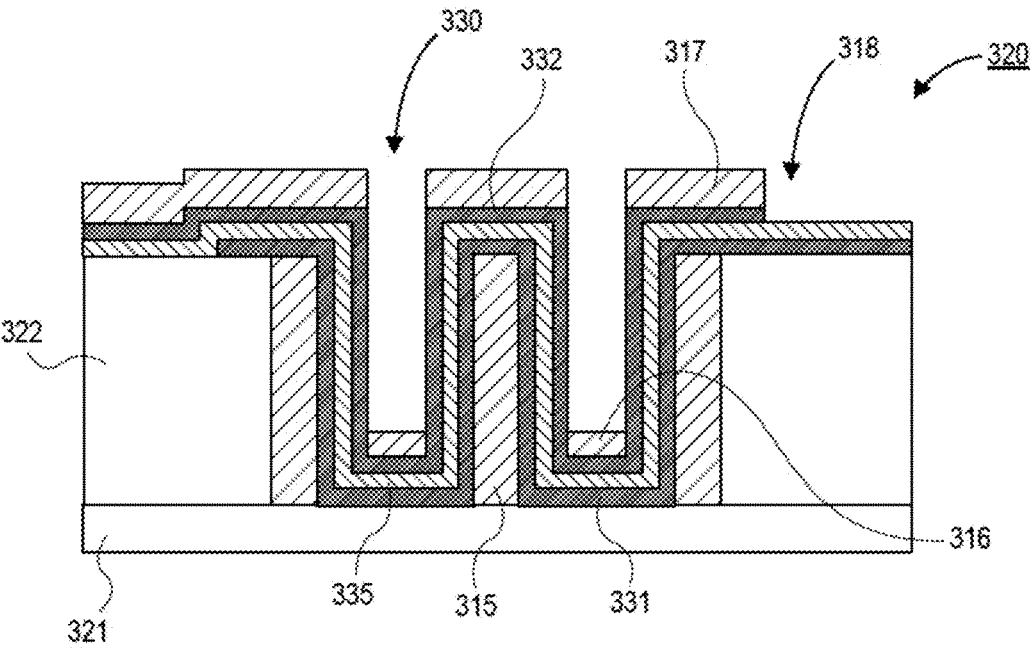

Referring now to FIG. 3H, a cross-sectional illustration of the capacitor region 320 after an etching process is shown, in accordance with an embodiment of the present disclosure. As shown, the right edge of the second electrode 332 and the third metal layer 317 are etched back to form an opening 318. This allows for the underlying first electrode 331 to be selectively coupled to a conductive via in a subsequent processing operation.

Figure 3I:
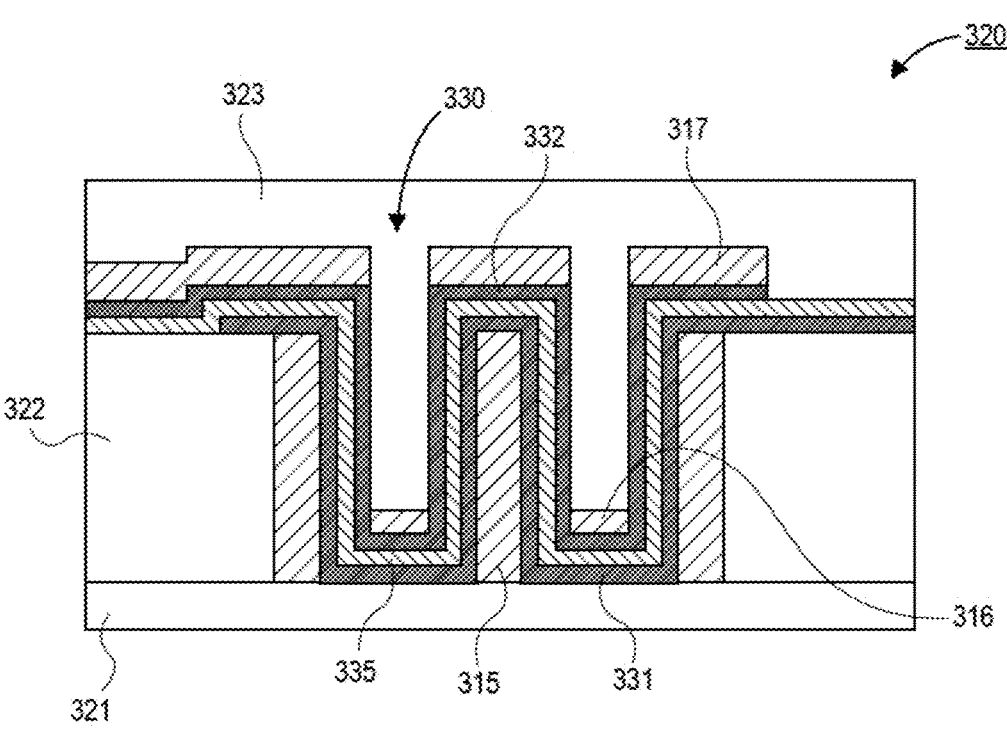

Referring now to FIG. 3I, a cross-sectional illustration of the capacitor region 320 after a third buildup layer 323 is disposed over the capacitor is shown, in accordance with an embodiment of the present disclosure. The third buildup layer 323 may be formed with any suitable process, such as CVD or the like.

Figure 3J:
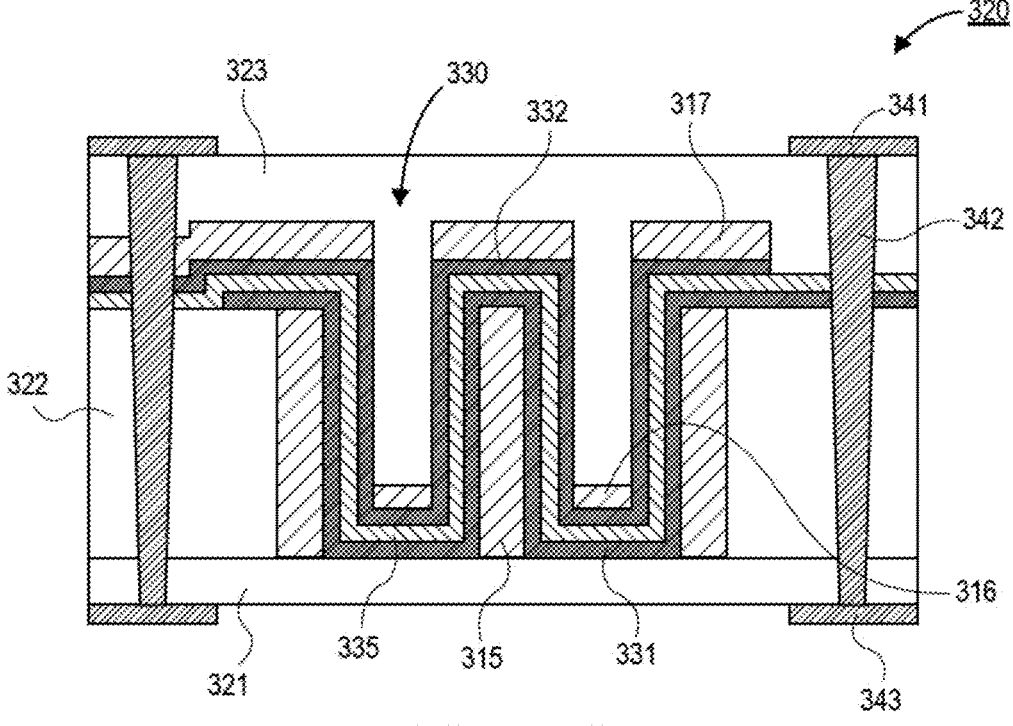

Referring now to FIG. 3J, a cross-sectional illustration of the capacitor region 320 after vias 342 are formed is shown, in accordance with an embodiment of the present disclosure. The vias 342 may be provided between pads 341 and 342 above and below the capacitors. In an embodiment, the via 342 on the left is coupled to the second electrode 332, and the via 342 on the right is coupled to the first electrode 331.

Figure 4:
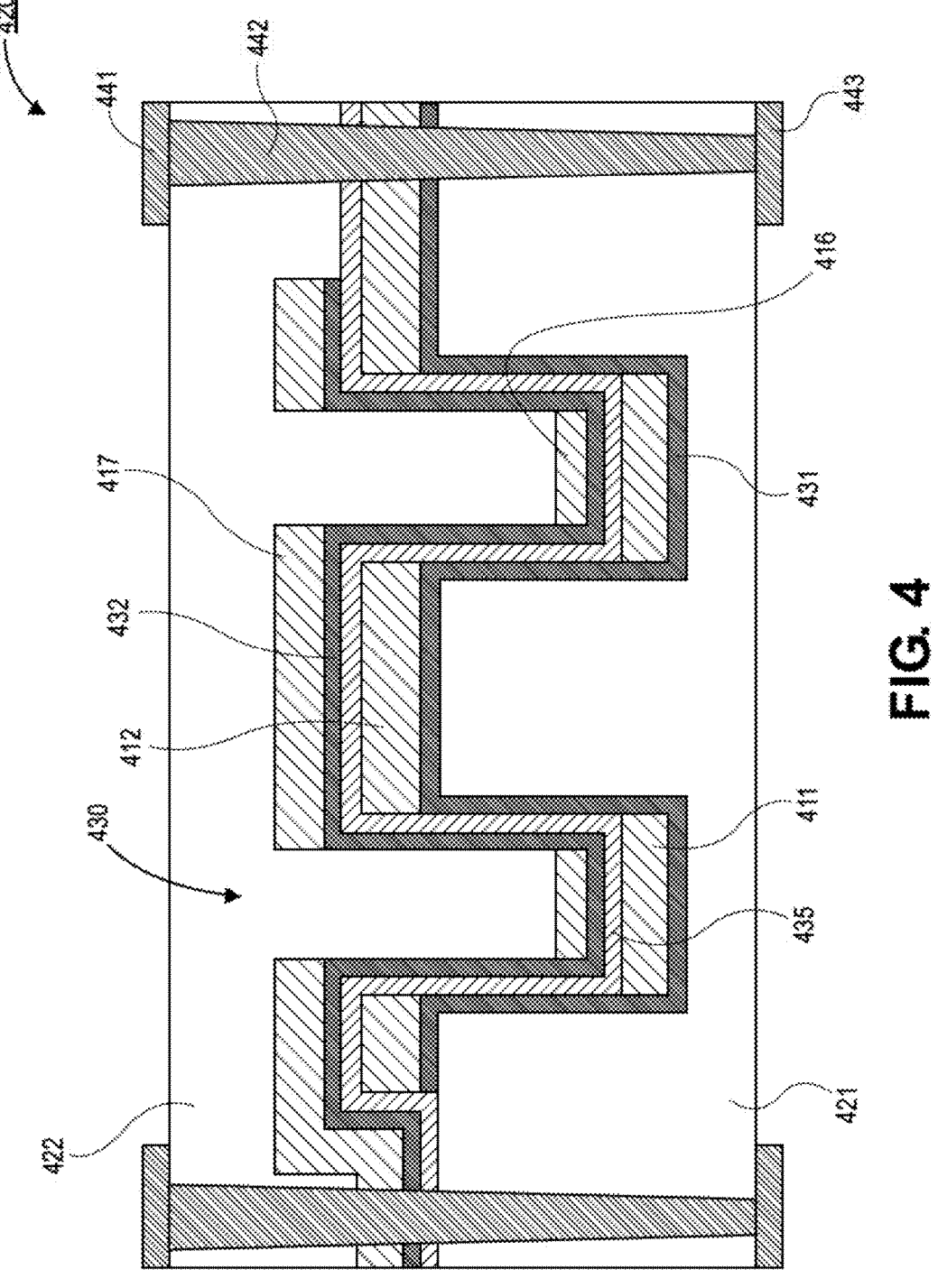
FIG. 4 is a cross-sectional illustration of a deep trench capacitor with thickened top and bottom electrodes, in accordance with an additional embodiment of the present disclosure.

Referring now to FIG. 4, a cross-sectional illustration of a capacitor region 420 is shown, in accordance with an additional embodiment of the present disclosure. As shown, the capacitor region 420 includes a first buildup layer 421 and a second buildup layer 422. A plurality of trenches 430 may be provided into the first buildup layer 421. The trenches 430 may be lined with capacitors that are formed by a first electrode 431, an insulating layer 435, and a second electrode 432. In addition to the electrodes 431 and 432, metal layers 411, 416, 412, and 417 may also be provided. The metal layers 411, 416, 412, and 417 may be provided over planar surfaces. That is, the sidewalls of the trench 430 are not covered by the extra metal layers 411, 416, 412, and 417.

In an embodiment, metal layer 411 may be provided at a bottom of the trenches 430. The metal layer 411 may be between the first electrode 431 and the insulating layer 435. The metal layer 416 may be provided at the bottom of the trenches 430 above the second electrode 432. The metal layers 412 may be provided over the top surface of the buildup layer 421. Particularly, the metal layers 412 are between the first electrode 431 and the insulating layer 435. The metal layers 417 may be provided over the second electrode 432 outside of the trenches 430.

The metal layers 411, 416, 412, and 417 function to increase the effective thickness of the first electrode 431 and the second electrode 432. By increasing the effective thickness of the electrodes 431 and 432, the resistance of the capacitors in the capacitor region 420 is decreased. This improves overall performance of the device. In an embodiment, the metal layers 411, 416, 412, and 417 may be the same material as the electrodes 431 and 432. In other embodiments, the metal layers 411, 416, 412, and 417 may be different materials than the electrodes 431 and 432.

In an embodiment, vias 442 may be provided between pads 441 and 443. The vias 442 may selectively contact one of the first electrode 431 or the second electrode 432. As shown, the trace extending out toward the vias 442 for both the first electrode 431 and the second electrode 432 are both increased in thickness. For example, the second electrode 432 on the left includes metal layer 417, and the first electrode 431 on the right includes metal layer 412.

In a second aspect, hybrid physical vapor deposition (PVD) and atomic layer deposition (ALD) bottom electrodes for on-die decoupling capacitors with low resistance are described.

To provide context, previous approaches have included use of a thicker top electrode (TE) and bottom electrode (BE) thickness. However, for small opening and deep trench structure, the TE and BE thickness cannot be increased.

In accordance with one or more embodiments, a combined ALD and PVD approach is implemented to solve or reduce the RC issue and/or to increase the process window. Embodiments can be implemented to reduce RC by 100×.

Referring now to FIGS. 5A-5I, a series of cross-sectional illustrations depicting a process for forming a capacitor region 520 similar to the capacitor region 420 shown in FIG. 4 is shown, in accordance with an embodiment of the present disclosure.

Figure 5A:
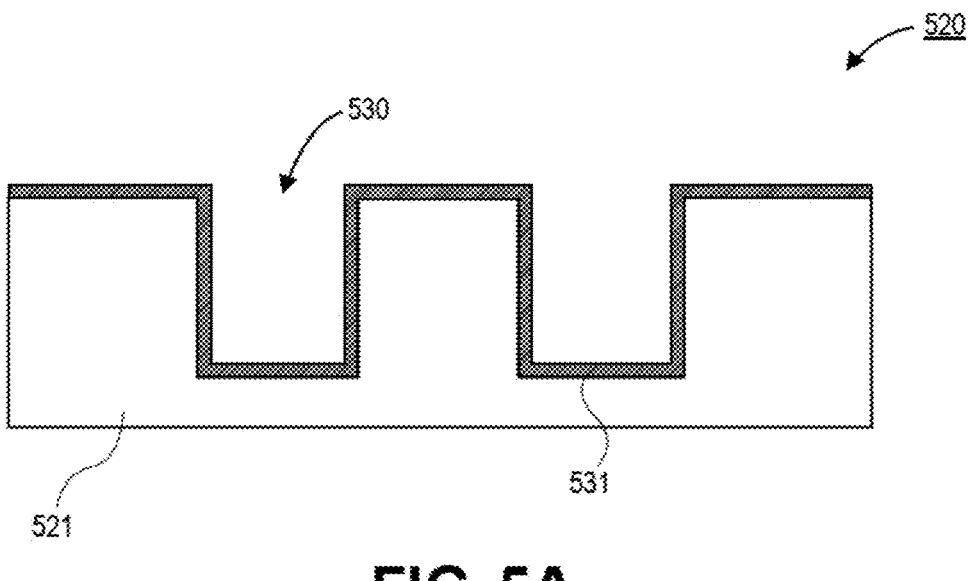
FIGS. 5A-5I are cross-sectional illustrations depicting a process for forming a deep trench capacitor with thickened top and bottom electrodes, in accordance with an additional embodiment of the present disclosure.

Referring now to FIG. 5A, a cross-sectional illustration of the capacitor region 520 at a stage of manufacture is shown, in accordance with an embodiment of the present disclosure. As shown, a plurality of trenches 530 may be provided into the buildup layer 521. While two trenches 530 are shown, it is to be appreciated that any number of trenches 530 may be included. In an embodiment, a first electrode 531 is provided over the dielectric layer 521 and lining the trenches 530. The first electrode 531 may be deposited with a conformal deposition process, such as an ALD process.

Figure 5B:
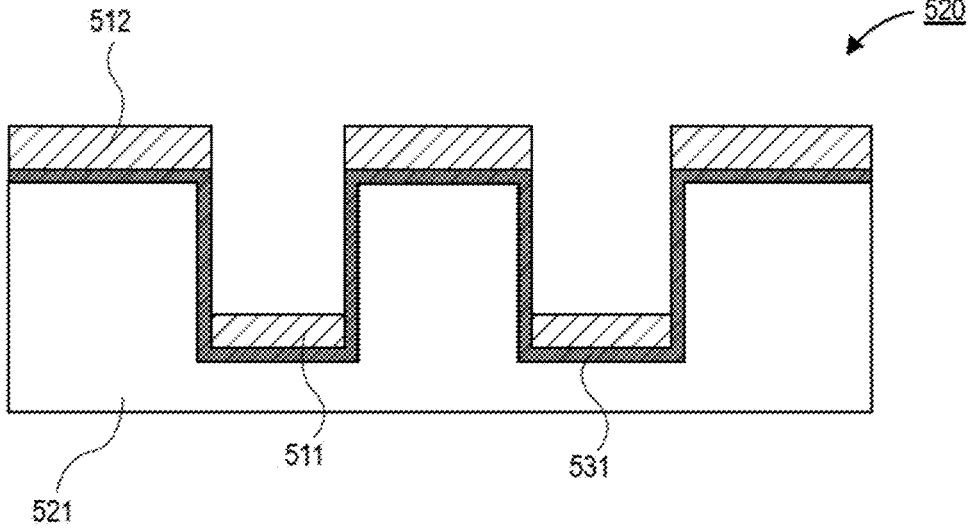

Referring now to FIG. 5B, a cross-sectional illustration of the capacitor region 520 after metal layers 511 and 512 are deposited is shown, in accordance with an embodiment of the present disclosure. In an embodiment, the metal layers 511 and 512 may be deposited with a non-conformal deposition process, such as PVD or the like. As such, there is no additional metal deposited along sidewalls of the trench 530 over the first electrode 531. The metal layers 511 may be provided at a bottom of the trench 530, and metal layers 512 may be provided over the top surfaces of the buildup layer 521. A thickness of the metal layers 511 may be less than a thickness of the metal layers 512. In an embodiment, the metal layers 511 and 512 may be the same material as the first electrode 531, or the metal layers 511 and 512 may be a different material than the first electrode 531.

Figure 5C:
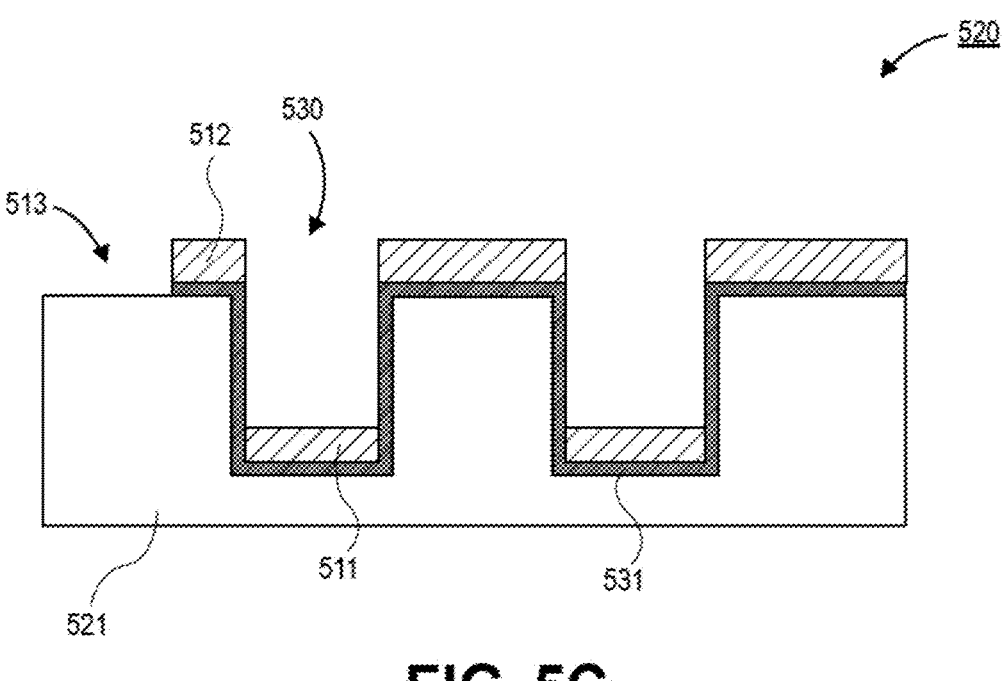

Referring now to FIG. 5C, a cross-sectional illustration of the capacitor region 520 after an etching process is shown, in accordance with an embodiment of the present disclosure. As shown, the left end of the first electrode 531 and the metal layer 512 is etched away to form opening 513 that exposes a top surface of the buildup layer 521.

Figure 5D:
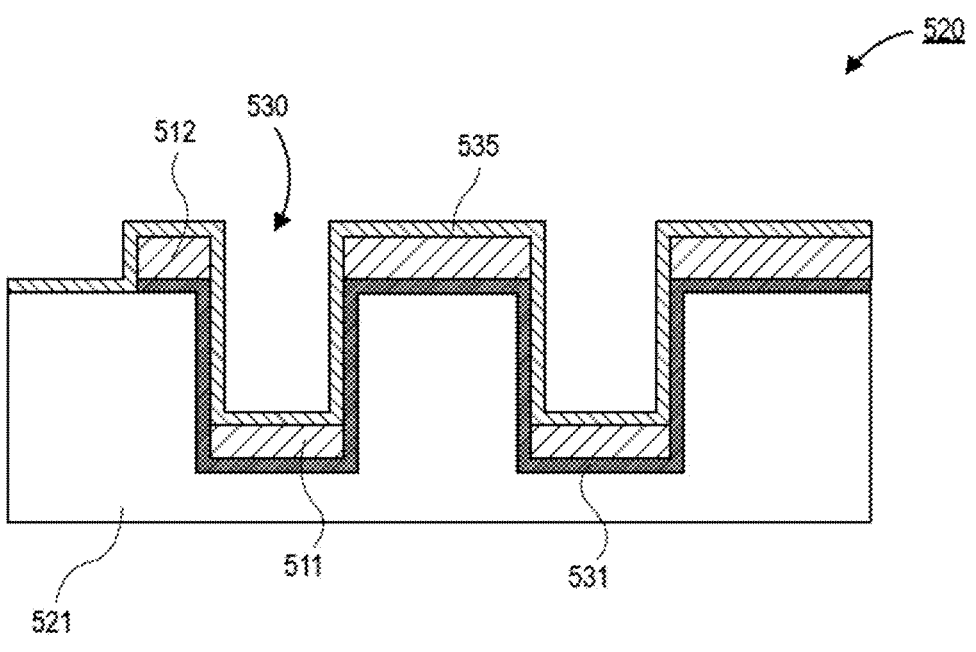

Referring now to FIG. 5D, a cross-sectional illustration of the capacitor region 520 after an insulating layer 535 is deposited is shown, in accordance with an embodiment of the present disclosure. In an embodiment, the insulating layer 535 may be deposited with a conformal deposition process, such as ALD or the like. The insulating layer 535 may line the sidewalls of the first electrode 531 in the trench 530. The insulating layer 535 may also line the metal layers 511 at the bottom of the trench 530 and the metal layers 512 outside of the trench 530. The insulating layer 535 may also contact the buildup layer 521 (e.g., at the left edge of the capacitor region 520).

Figure 5E:
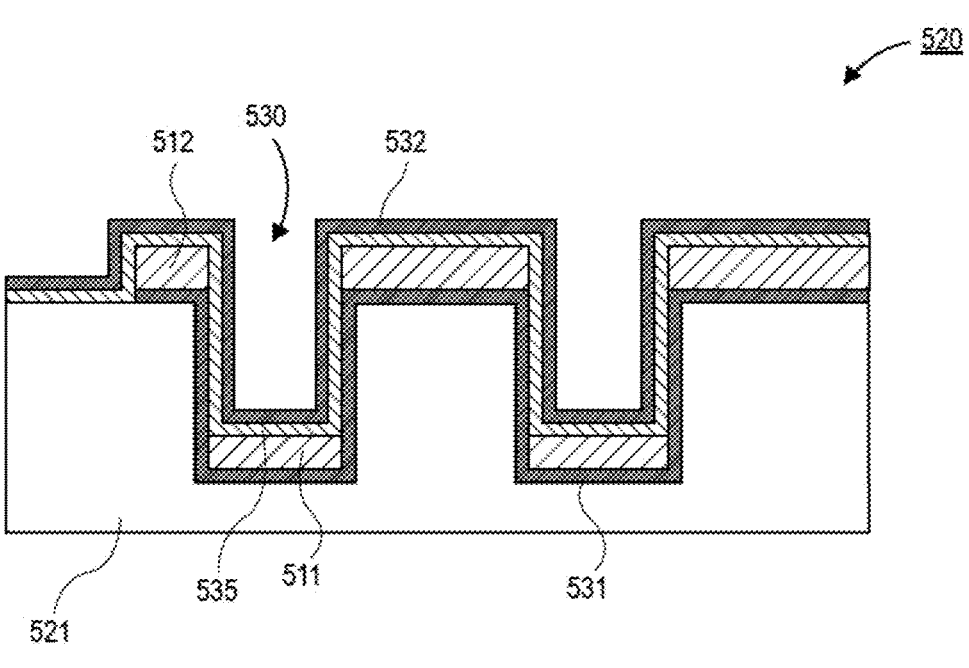

Referring now to FIG. 5E, a cross-sectional illustration of the capacitor region 520 after a second electrode 532 is deposited is shown, in accordance with an embodiment of the present disclosure. In an embodiment, the second electrode 532 may be deposited with a conformal deposition process, such as an ALD process or the like. In an embodiment, the second electrode 532 is in direct contact with the insulating layer 535 inside the trench 530 and outside the trench 530.

Figure 5F:
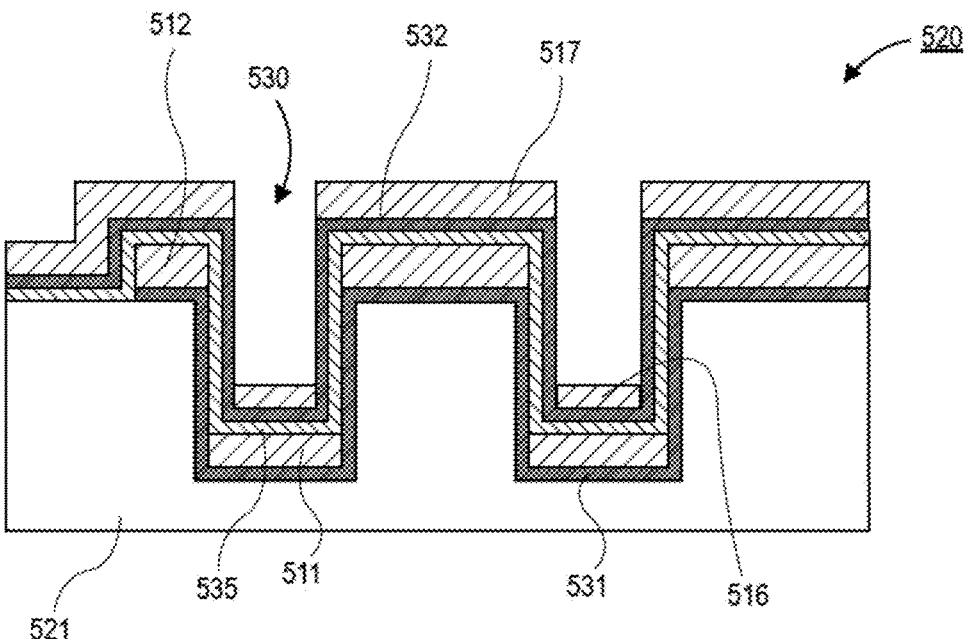

Referring now to FIG. 5F, a cross-sectional illustration of the capacitor region 520 after metal layers 516 and 517 are deposited is shown, in accordance with an embodiment of the present disclosure. As shown, metal layers 516 may be provided over the second electrode 532 at a bottom of the trench 530, and metal layers 517 may be provided over the second electrode 532 outside of the trench 530. The metal layers 516 and 517 may be deposited with a non-conformal process, such as a PVD process or the like. As such, sidewalls of the second electrode 532 in the trench 530 are not covered by additional metal. In an embodiment, the metal layers 516 and 517 may be the same material or different material than the second electrode 532.

Figure 5G:
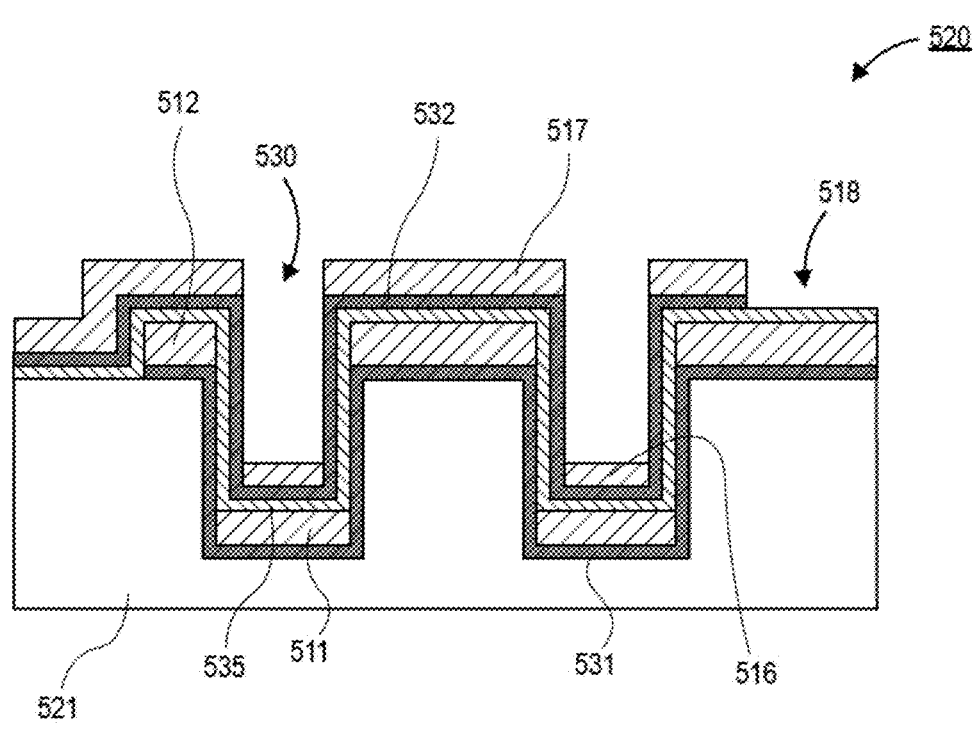

Referring now to FIG. 5G, a cross-sectional illustration of the capacitor region 520 after an etching process is shown, in accordance with an embodiment of the present disclosure. In an embodiment, the etching process results in the removal of portions of the second electrode 532 and the metal layer 517 from the right side of the capacitor region 520. For example, opening 518 exposes the insulating layer 535. This allows a subsequently formed via to selectively contact the first electrode 531.

Figure 5H:
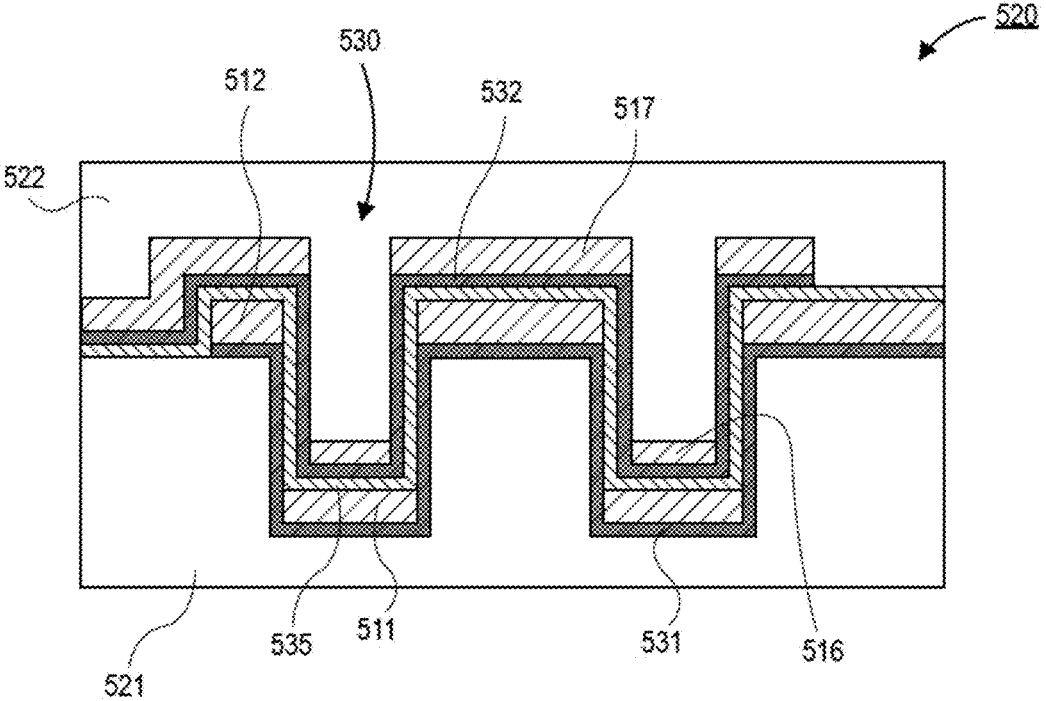

Referring now to FIG. 5H, a cross-sectional illustration of the capacitor region 520 after a second buildup layer 522 is formed over the capacitors is shown, in accordance with an embodiment of the present disclosure. The second buildup layer 522 may fill the remainder of the trenches 530. The second buildup layer 522 may be deposited with any suitable deposition process, such as CVD or the like.

Figure 5I:
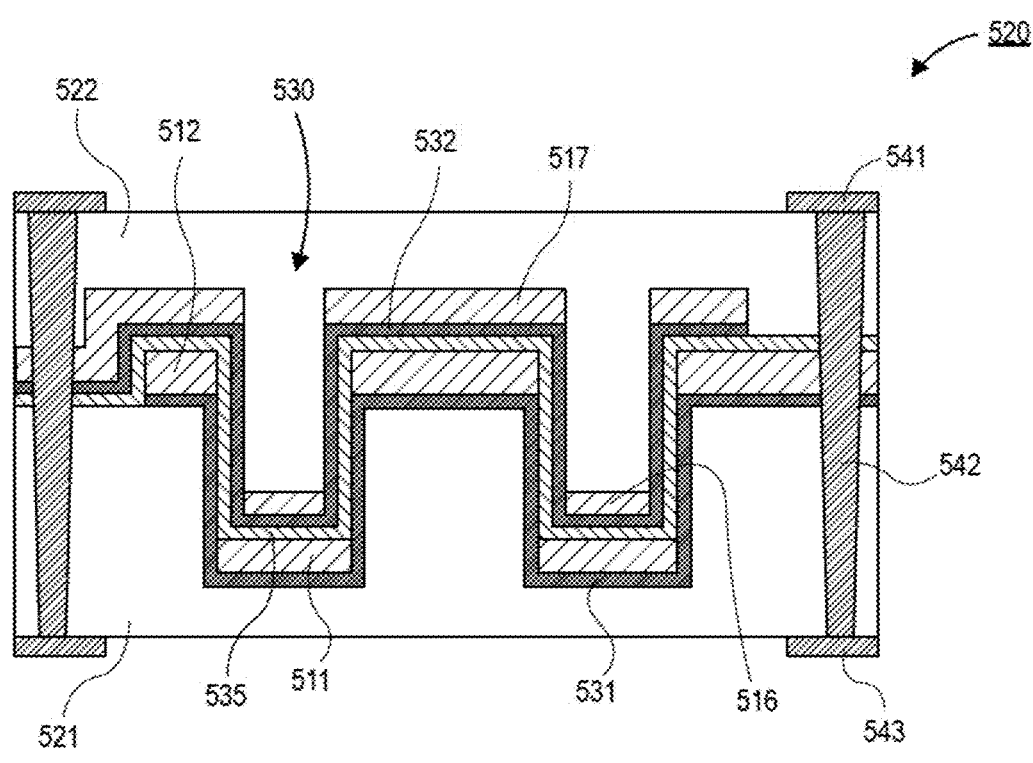

Referring now to FIG. 5I, a cross-sectional illustration of the capacitor region 520 after vias 542 are formed is shown, in accordance with an embodiment of the present disclosure. The vias 542 may be provided between pads 541 and 543. The via 542 on the left may contact the second electrode 532, and the via 542 on the right may contact the first electrode 531. As illustrated, the effective thicknesses of the first electrode 531 and the second electrode 532 are increased. Particularly, the portions of the first electrode 531 and the second electrode 532 that extend out to the vias 542 are thickened by the metal layers 512 and 517. This is particularly beneficial since this extension out to the vias 542 may be relatively long (e.g., 10 μm or greater). As such, resistance in the capacitors is decreased.

In an embodiment, an ALD high-k dielectric stack includes $SrTiO_3$, $BaTiO_3$, $BaHfO_3$, $BaZrO_3$, $LaAlO_3$, $LaCoO_3$, $SrSnO_3$ or combinations thereof. In an embodiment, ALD conductive layer/electrodes to enable high AR deposition can include (1) ALD Ru, $RuO_2$, $IrO_2$, Mo, $MoO_2$, Rh, Re, W, or Pt, or (2) ALD $ABX_3$ perovskite complex oxides, e.g. $LaNiO_3$, $LaRuO_3$, $SrVO_3$, $SrCoO_3$, $SrMoO_3$, or $SrRuO_3$ to enable high quality metal-insulator interface.

In a third aspect, high-capacitance density $TiO_2$-based deep-trench decoupling capacitors are described. Embodiments can be implemented to increase the capacitance density of MIM to improve CMOS technology.

To provide context, previous approaches have included the use of TiN/HfO2/TiN, TiN/HfZrOx/TiN or TiN/HfAlOx/TiN MIMs. However, Hf-based oxides have low dielectric constant (k~25).

In accordance with one or more embodiments of the present disclosure, ALD $TiO_2$ is used in a MIM with a deep-trench structure, which k is 2 to 4× higher than that of Hf-based oxides. Embodiments can be implemented to increase the capacitance density of standard MIM capacitors, and drive a voltage reduction that leads to improved CMOS performance.

Figure 6A:
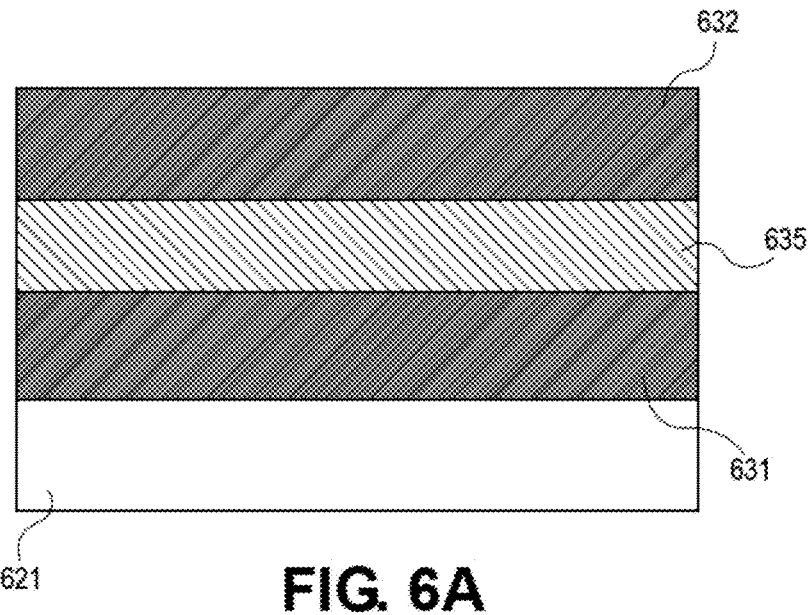
FIG. 6A is a cross-sectional illustration of a planar MIM capacitor, in accordance with an embodiment of the present disclosure.

Referring now to FIG. 6A, a cross-sectional illustration of a capacitor stack is shown, in accordance with an embodiment of the present disclosure. In the illustrated embodiment, the capacitor is a stacked plate capacitor or a planar capacitor. Though, as will be described in greater detail below, non-planar capacitor architectures may also be made with such material systems.

In an embodiment, the capacitor is provided over a substrate 621, such as a buildup layer in the BEOL stack of a semiconductor device. The capacitor may be used as a decoupling capacitor in some embodiments. In an embodiment, the capacitor may include a first electrode 631 and a second electrode 632. The first electrode 631 and the second electrode 632 may be the same material. In other embodiments, the first electrode 631 and the second electrode 632 may be different materials. In a particular embodiment, the first electrode 631 and the second electrode may include, Ru, $RuO_2$, $IrO_2$, $MoO_2$, Re, TiN, W, or Mo. Additionally, while shown as a single layer, it is to be appreciated that the first electrode 631 and/or the second electrode 632 may include a multi-layer architecture with two or more different materials.

In an embodiment, an insulating layer 635 may be provided between the first electrode 631 and the second electrode 632. The insulating layer 635 may be deposited with any suitable deposition process, such as ALD or the like. The insulating layer 635 may be a hafnium free insulating layer. For example, the insulating layer 635 may include titanium and oxygen (e.g., $TiO_2$) in some embodiments.

Figure 6B:
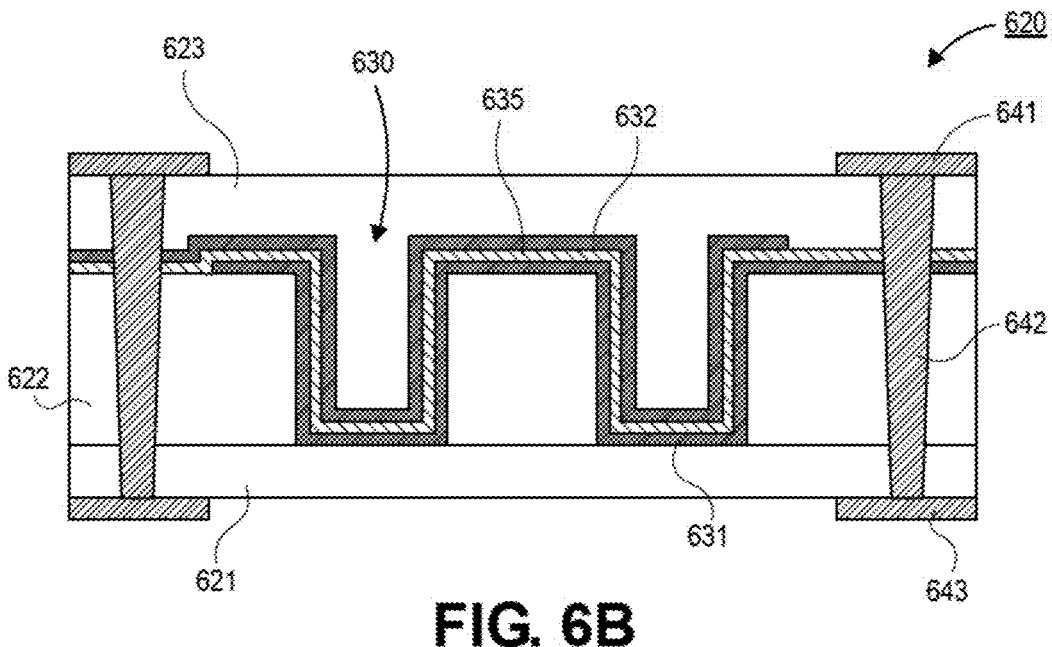
FIG. 6B is a cross-sectional illustration of a deep trench capacitor, in accordance with an embodiment of the present disclosure.

Referring now to FIG. 6B, a cross-sectional illustration of a capacitor region 620 is shown, in accordance with an embodiment of the present disclosure. In an embodiment, the capacitor region 620 may include a first buildup layer 621, a second buildup layer 622, and a third buildup layer 623. Trenches 630 may be provided into the second buildup layer 622. The trenches 630 may be lined by a capacitor stack that includes a first electrode 631, an insulating layer 635, and a second electrode 632. The first electrode 631, the insulating layer 635, and the second electrode 632 may include materials similar to those described in greater detail above with respect to FIG. 6A. Particularly, all of the materials used are compatible with conformal deposition processes (e.g., ALD process). As such, the trenches 630 can be conformally lined by the non-planar capacitor architecture. The third buildup layer 623 may fill the remainder of the trenches 630. In an embodiment, vias 642 may be provided between pads 641 and 643. A via on the left contacts the second electrode 632, and a via on the right contacts the first electrode 631.

Figure 6C:
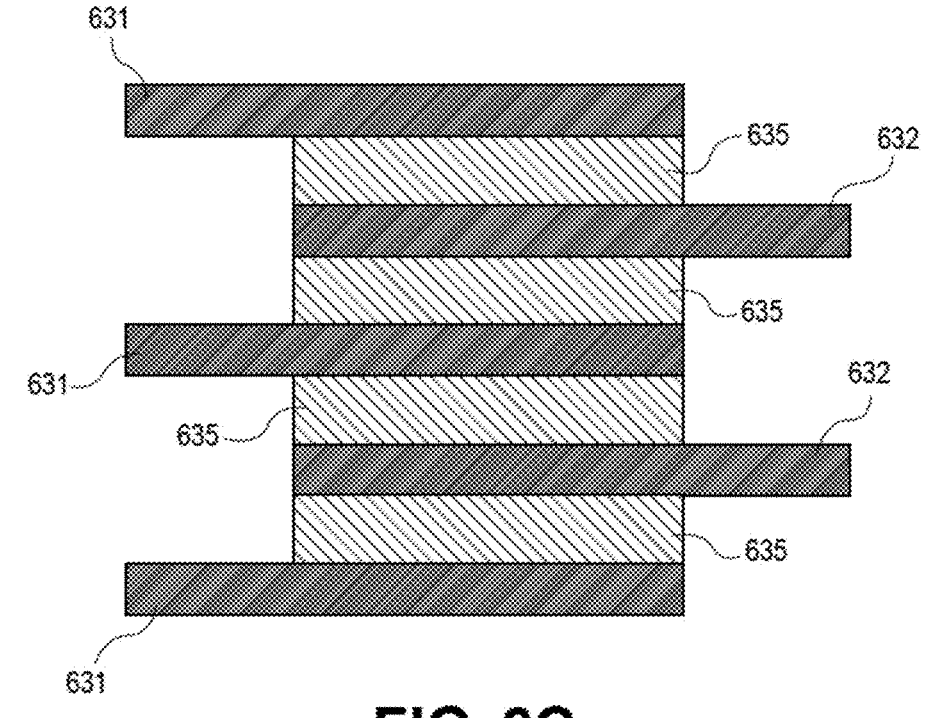
FIG. 6C is a cross-sectional illustration of a multi-plate capacitor, in accordance with an embodiment of the present disclosure.

Referring now to FIG. 6C, a cross-sectional illustration of a multi-plate capacitor stack is shown, in accordance with an embodiment of the present disclosure. In an embodiment, the capacitor stack includes a plurality of capacitors arranged in a stack. Each capacitor may include a first electrode 631, an insulating layer 635, and a second electrode 632. The stacked architecture allows for increases in capacitance density. The materials for the first electrode 631, the second electrode 632, and the insulating layer 635 may be similar to the materials described in greater detail above with respect to FIG. 6A.

In a fourth aspect, multi-plate MIM architectures with improved reliability are described.

To provide context, higher capacitance from a BEOL-compatible MIM capacitor is required to reduce first voltage droop in power delivery system at advanced technology nodes. However, in multi-plate MIM architecture using STO, there is a reliability issue when high voltage (e.g., 1.89V) is applied due to worse TDDB behavior in one of the bias polarities.

In accordance with one or more embodiments of the present disclosure, the reliability issue is overcome by introducing HfAlOx in one of layers in a multi-plate architecture and also to have high-voltage only be applied to a few assigned STO layers. Advantages to implementing embodiments described herein can include that capacitance from nominal and extreme high voltage conditions can be significantly improved. In an embodiment, the top and bottom layers of a multi-plate architecture are STO for high voltage usage conditions, and the rest of STO is used in nominal conditions. When stacking up and transitioning to the top layer for high voltage condition, HfAlOx is used to provide a smooth transition for high voltage without causing reliability issue. Although a 6-plate capacitor is described below, in general, embodiments can be applied to any number of plates.

Figure 7A:
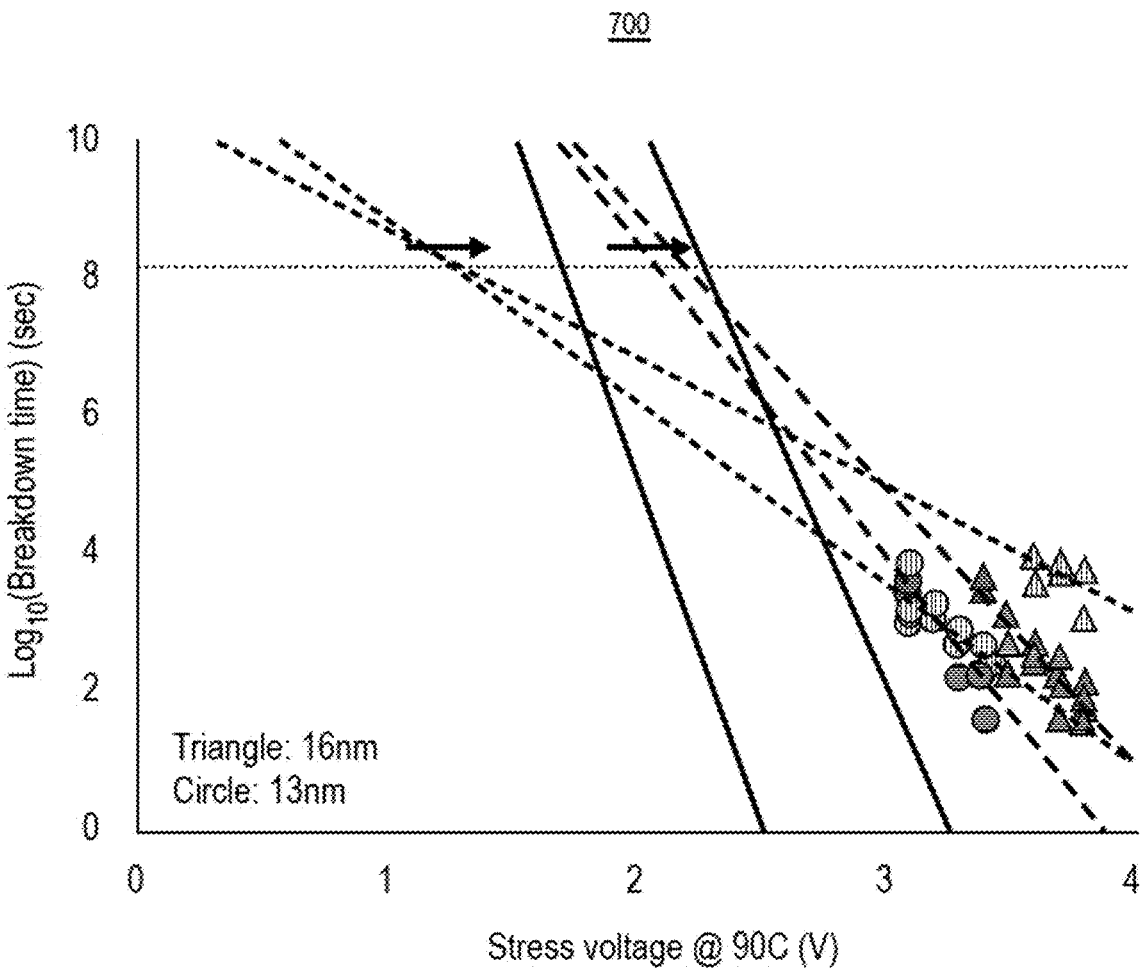
FIG. 7A is a plot of stress voltage versus breakdown time, in accordance with an embodiment of the present disclosure.

Referring now to FIG. 7A, a plot 700 that illustrates a reliability issue that may arise with multi-plate MIM capacitors using STO is shown, in accordance with an embodiment of the present disclosure. As shown the negative bias polarity breakdown (dashed lines to the left with a shallower slope) is less than that of the positive bias polarity breakdown (dashed lines to the right with a steeper slope) at the eight second breakdown time.

Accordingly, the reliability issue is overcome by introducing an insulating layer that includes hafnium, aluminum, and oxygen (e.g., HfAlOx) in one of the layers in the multi-plate architecture. Additionally, high voltage capacitors in the stack are provided in only a selected locations. The remainder of the capacitors are nominal voltage capacitors. Embodiments disclosed herein allow for both capacitance from nominal and extreme high voltage conditions to be significantly improved.

Figure 7B:
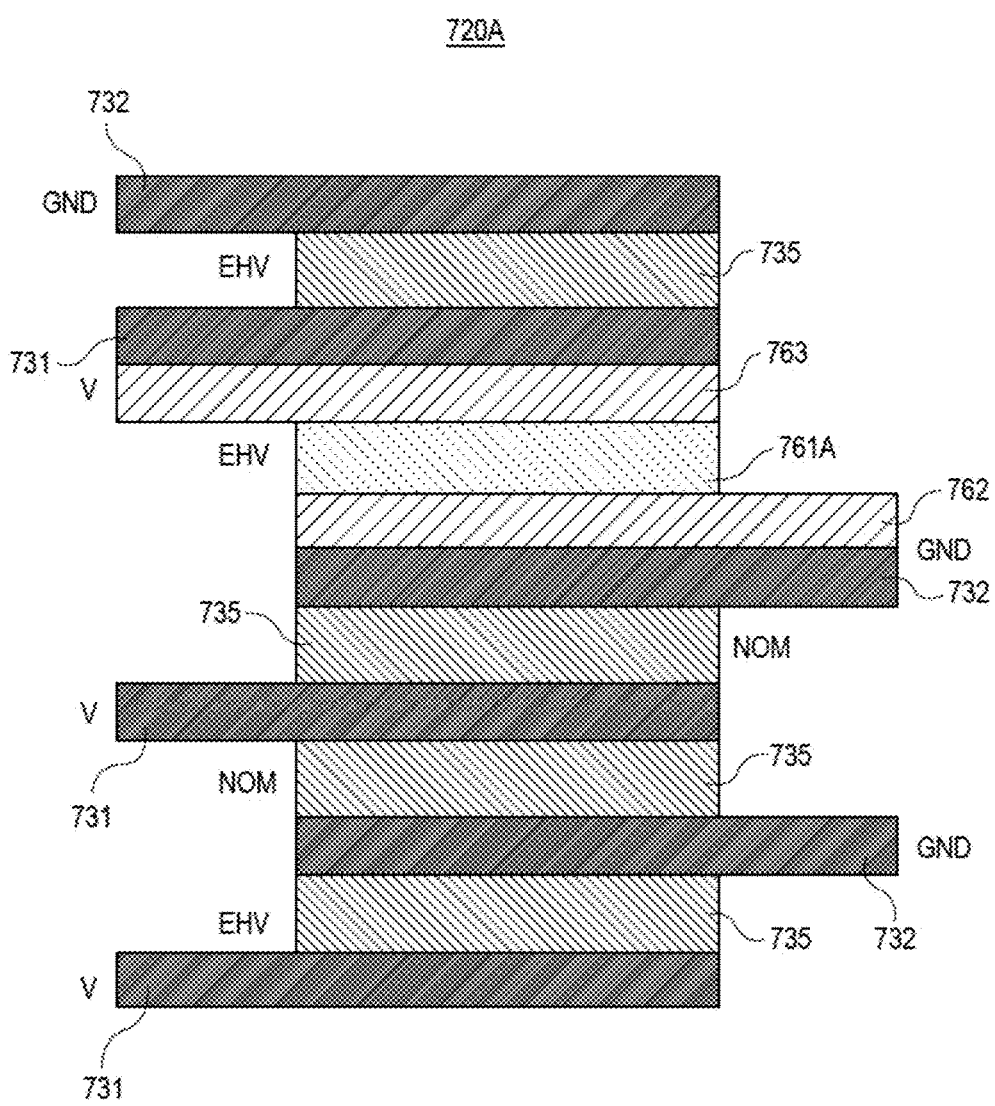
FIG. 7B is a cross-sectional illustration of a multi-plate capacitor, in accordance with an embodiment of the present disclosure.

Referring now to FIG. 7B, a cross-sectional illustration of a multi-plate MIM capacitor 720A is shown, in accordance with an embodiment of the present disclosure. In an embodiment, electrodes 731 and 732 may include ruthenium, and insulating layers 735 may include STO (e.g., $SrTiO_3$). The electrode 762 and 763 may be a different conductive material in order to accommodate the different insulating layer 761A material. For example, electrodes 762 and 763 may include titanium and nitrogen (e.g., TiN). The insulating layer 761A may include $HfAlO_2$.

In an embodiment, the top and bottom insulating layers 735 of the multi-plate architecture may be STO insulating layers for use with extreme high voltage (EHV) conditions, and the rest of the STO insulating layers 735 may be used for nominal voltages (NOM). As used herein, an EHV condition may be a voltage that is greater than the NOM condition. When stacking up and transitioning to the top layer for the high voltage condition, an HfAlOx insulating layer 761A is required to provide a smooth transition for extreme high voltage without causing reliability issues. In FIGS. 7B, a six plate capacitor structure is shown. However, it is to be appreciated that there may be any number of capacitor plates.

Figure 7C:
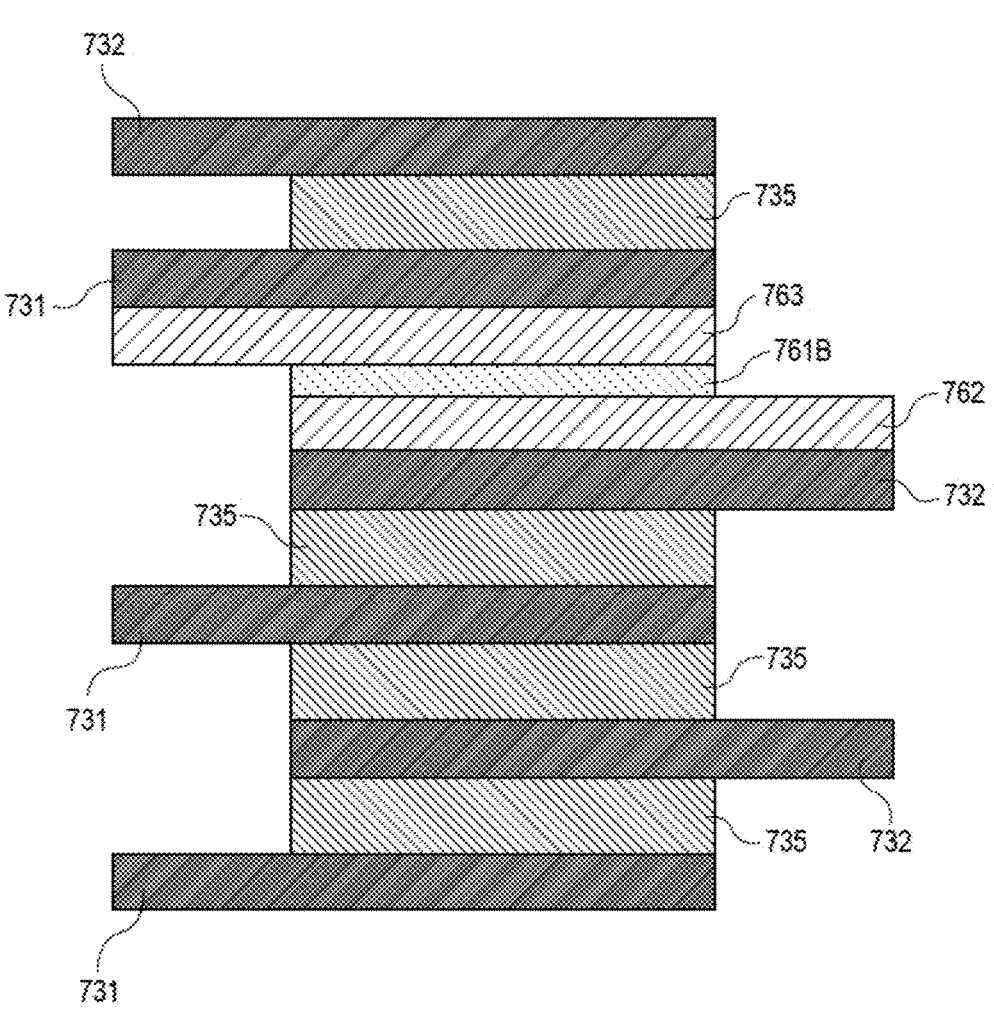
FIG. 7C is a cross-sectional illustration of a multi-plate capacitor, in accordance with an additional embodiment of the present disclosure.

Referring now to FIG. 7C, a cross-sectional illustration of a multi-plate MIM capacitor 720B is shown, in accordance with an embodiment of the present disclosure. In an embodiment, the MIM capacitor in FIG. 7C may be substantially similar to the MIM capacitor in FIG. 7B, with the exception of the thicknesses of the insulating layers 735 and 761B. Particularly, the insulating layer 761B may be thinner than the insulating layers 735. For example, the insulating layers 735 may be between approximately 10 nm and 20 nm thick, and the insulating layer 761B may be between approximately 3 nm and 7 nm thick. The insulating layer 761B may include $HfAlO_2$.

In a fifth aspect, a bi-layer strontium titanium oxide (STO) MIM with composition variation is described. Embodiments can include a high density MIM capacitor with Sr-rich STO/Ti-rich STO layers. Embodiments can be implemented to increase capacitance density of MIM capacitors in CMOS technology.

In accordance with an embodiment of the present disclosure, a Sr-STO/Ti-rich STO dual layer with very high dielectric constant and low leakage is used in a MIM stack. Advantages for implementing embodiments described herein can include use of a high dielectric constant to improved CPU performance as a result of increased MIM capacitance. The implementation of embodiments described can be detectable based on a stacking difference versus single layer MIM capacitors.

Figure 8A:
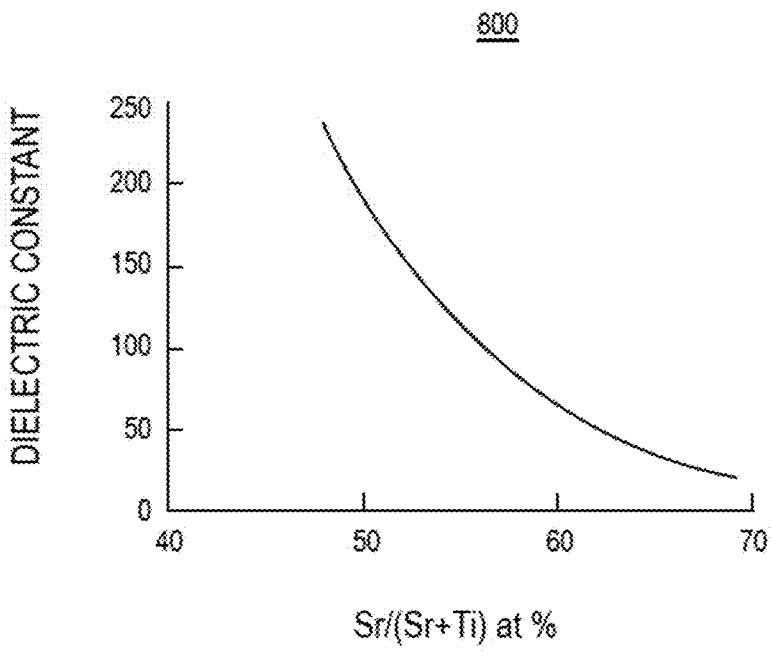
FIG. 8A is a plot of dielectric constants for strontium titanium oxide of various atomic percentages, in accordance with an embodiment of the present disclosure.
Figure 8B:
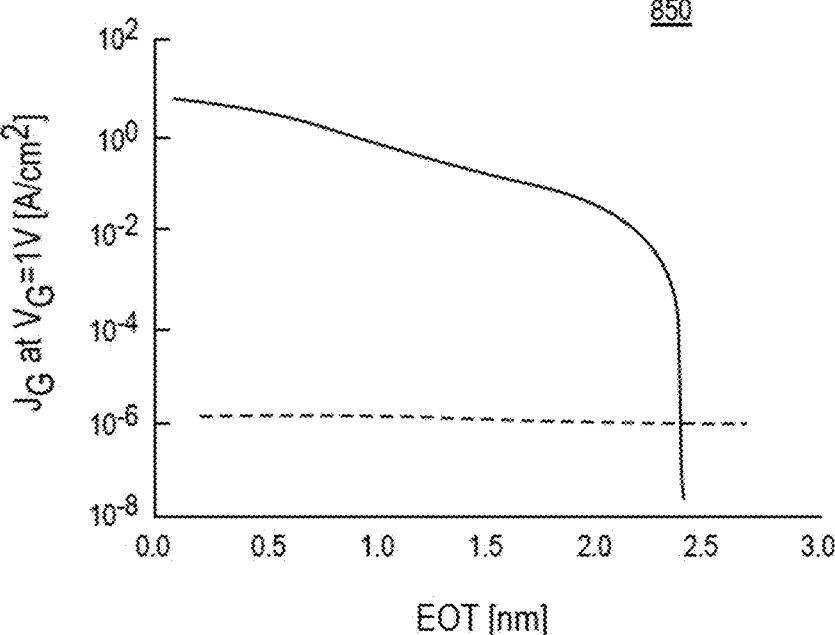
FIG. 8B is a plot of leakage current versus effective oxide thickness, in accordance with an embodiment of the present disclosure.

Referring now to FIG. 8A, a plot 800 of the dielectric constant versus strontium (Sr) atomic composition in an STO layer is shown. As shown, as the Sr value approaches 50% (i.e., the stoichiometric value), the dielectric constant increases. This is beneficial for providing improved performance in the capacitors. However, as shown in the plot 850 of FIG. 8B, electrical leakage of the stoichiometric composition (solid line) is relatively high compared to the electrical leakage of the Sr-rich composition (dashed line). Ideally, the leakage should be less than $10^{-4}$ $A/cm^2$, and the Sr-rich composition provides a $10^{-6}$ A/cm 2 leakage. Accordingly, when taking the information from both plots, the stoichiometric composition is better for high dielectric constants, but the Sr-rich composition is better for low leakage.

In an embodiment, a dielectric layer in MIM capacitor is formed by two layers, namely Sr-rich STO and Ti-rich STO or Stoichiometric STO layers. In one embodiment, the Sr-rich STO layer is between 1-10 nm and enables low temperature STO crystallization and low leakage. The Ti-rich STO or Stoichiometric STO provides the high-k>150.

Accordingly, embodiments disclosed herein can include a bi-layer insulating layer that takes the benefits of both material compositions. The initial layer of the insulating layer may be Sr-rich to aid in leakage reduction, and the second layer of the insulating layer may be a stoichiometric composition to provide an improved dielectric constant.

Figure 9A:
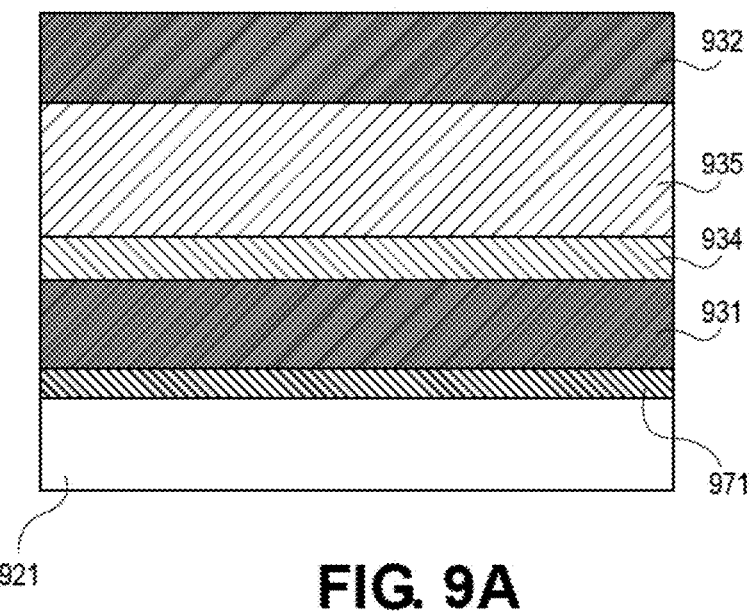
FIG. 9A is a cross-sectional illustration of a MIM capacitor with a bi-layer dielectric, in accordance with an embodiment of the present disclosure.

Referring now to FIG. 9A, a cross-sectional illustration of a capacitor 900 with a bi-layer insulating layer is shown, in accordance with an embodiment of the present disclosure. In an embodiment, the capacitor is formed on a substrate 921, such as a buildup layer. In an embodiment, a seed layer 971 (e.g., tantalum with a thickness of about 1 nm) may be provided over the substrate 921. A first electrode 931 may be provided over the seed layer 971. The first electrode 931 may include ruthenium, ruthenium oxide (e.g., with a thickness of about 20 nm), or any other suitable conductive material. In an embodiment, the insulating layer may then include an initial layer 934. The initial layer 934 may include a Sr-rich STO composition. In an embodiment, a thickness of the initial layer 934 may be between approximately 1 nm and approximately 10 nm. The insulating layer may also include a second layer 935. The second layer 935 may be a Ti-rich composition or a stoichiometric composition of STO. A thickness of the second layer 935 may be between approximately 10 nm and approximately 30 nm. In an embodiment, a second electrode 932 may be provided over the second layer 935. The second electrode 932 may be the same material as the first electrode 931, or the second electrode 932 may be a different material than the first electrode 931. For example, the second electrode may include ruthenium (e.g., with a thickness of about 20 nm).

In a first particular embodiment, the initial layer 934 is composed of $Sr_{1.14}Ti_{0.86}O_3$ with a dielectric constant of 120 and a thickness of 1 nm, and the second layer 935 is composed of stoichiometric $SiTiO_3$ with a dielectric constant of 220 and a thickness of 12 nm, for an effective dielectric constant of 207 at a total dielectric thickness of 13 nm. In a second particular embodiment, the initial layer 934 is composed of $Sr_{1.14}Ti_{0.86}O_3$ with a dielectric constant of 120 and a thickness of 2 nm, and the second layer 935 is composed of stoichiometric $SiTiO_3$ with a dielectric constant of 220 and a thickness of 11 nm, for an effective dielectric constant of 195 at a total dielectric thickness of 13 nm.

Figure 9B:
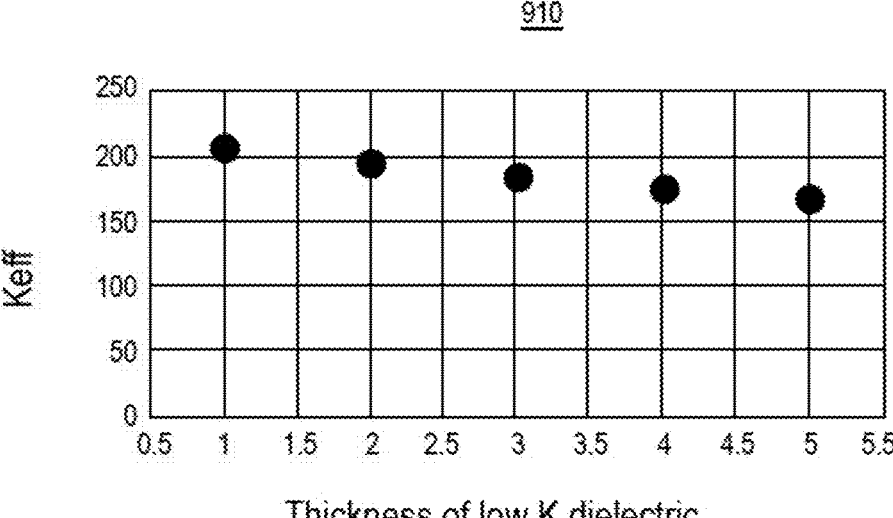
FIG. 9B is a plot of effective dielectric constant versus thickness of the low-k dielectric, in accordance with an embodiment of the present disclosure.

Referring now to FIG. 9B, a plot 910 of effective dielectric constant (Keff) versus the thickness of the Sr-rich STO initial layer 934 is shown, in accordance with an embodiment of the present disclosure. As shown, thicknesses of the Sr-rich STO initial layer 934 up to 5 nm still provides a Keff that is greater than 150. As such, high dielectric constants with good leakage performance are capable of being formed with such a bi-layer configuration.

Figure 9C:
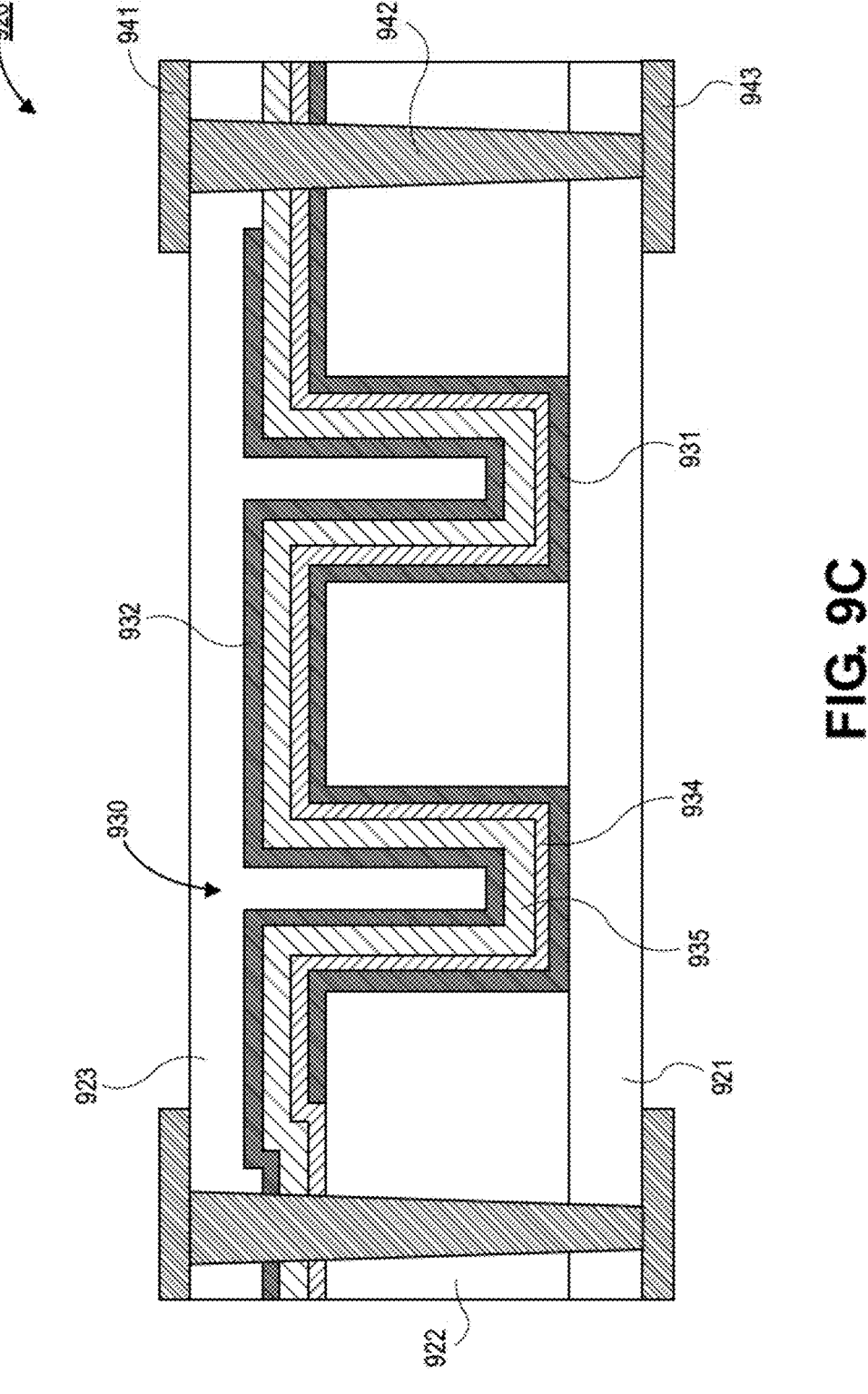
FIG. 9C is a cross-sectional illustration of a deep trench capacitor with a bi-layer dielectric, in accordance with an embodiment of the present disclosure.

Referring now to FIG. 9C, a cross-sectional illustration of a capacitor region 920 is shown, in accordance with an embodiment of the present disclosure. In an embodiment, the capacitor region 920 includes a first buildup layer 921, a second buildup layer 922, and a third buildup layer 923. Trenches 930 are provided in the second buildup layer 922. The trenches 930 may be partially filled by the capacitor structure. Namely, a first electrode 931, an initial insulating layer 934, a second insulating layer 935, and a second electrode 932 are provided in the trenches 930. The capacitor structure in the trenches 930 may be referred to as having a U-shape since they line the sidewalls and bottoms of the trenches 930. In an embodiment, the capacitor stack may include materials and material thicknesses that are similar to those described above with respect to FIG. 9A. The remainder of the trenches 930 may be filled with the third buildup layer 923. In an embodiment, a via 942 between pads 941 and 943 may contact either the first electrode 931 or the second electrode 932. For example, the via 942 on the right contacts the first electrode 931, and the via 942 on the left contacts the second electrode 932.

Embodiments described herein can be implemented as an on-die MIM capacitor for use in a power delivery system. As an example, FIG. 10 illustrates a cross-sectional view of an on-die MIM in a power delivery system 1000 and a corresponding circuit schematic 1002, in accordance with an embodiment of the present disclosure.

Figure 10:
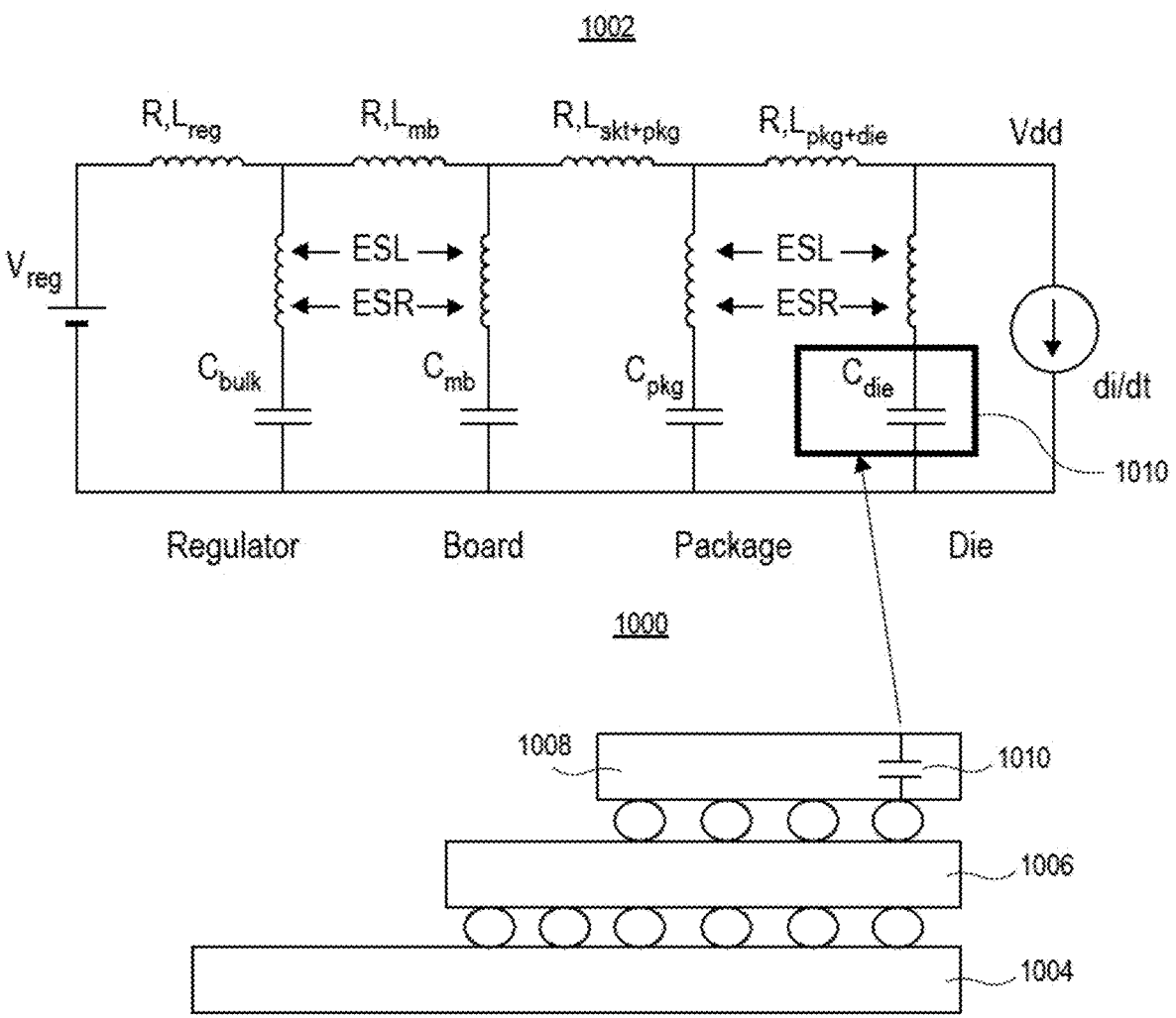
FIG. 10 illustrates a cross-sectional view of an on-die MIM in a power delivery system and a corresponding circuit schematic, in accordance with an embodiment of the present disclosure.

Referring to FIG. 10, the power delivery system 1000 includes a board 1004, a package 1006 coupled to the board 1004, and a die 1008 coupled to the package 1006. The die 1008 includes an on-die metal-insulator-metal (MIM) capacitor 1010.

In another aspect, one or more embodiments are directed to the use of a scalable and configurable parallel plate capacitor layering scheme in order to provide industry leading MIM capacitive densities, without compromising the reliability of the final device. Such a scaling method can be used to increase cap density without an area impact and can enhance existing designed layouts without extra design overhead. Increasing MIM capacitance provides a significant performance improvement.

Figure 11:
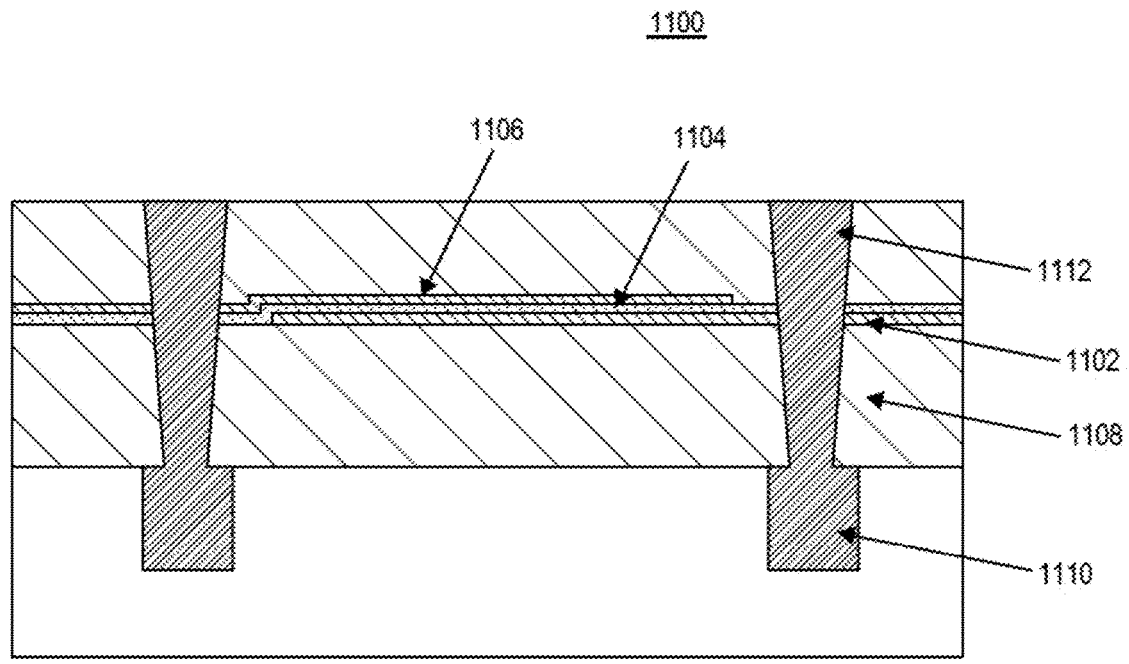
FIG. 11 illustrates a schematic depicting the integration of a MIM decoupling capacitor into a via interconnect stack, in accordance with an embodiment of the present disclosure.

To provide context, advanced transistor scaling requires an advanced and stable power delivery method. Decoupling capacitors are employed to minimize impedance and power supply noise. This has been leveraged in past by incorporating a metal-insulator-metal (MIM) capacitor in the interconnect stack as depicted in FIG. 11, described below. Higher overall total capacitance in such MIM capacitors can more effectively mitigate voltage droop and current ripples to the transistor and thereby enhance the overall performance of the final device. It is to be appreciated that the above architectures and materials for MIM capacitors can be implemented with and/or into embodiments described below.

FIG. 11 illustrates a schematic depicting the integration of a MIM decoupling capacitor into a via interconnect stack, in accordance with an embodiment of the present disclosure. Referring to FIG. 11, an integrated circuit structure 1100 includes a MIM capacitor having a bottom plate 1102, a high-k dielectric layer 1104, and a top plate 1106. The MIM capacitor is integrated within a passivation material 1108. Metal layers 1110 are below the MIM capacitor. MIM contact vias 1112 contact the MIM capacitor and the metal layers 1110. In particular, the MIM contact via 1112 on the right contacts the bottom plate 1102, and the MIM contact via 1112 on the left contacts the top plate 1106.

It is to be appreciated that previous technologies have utilized a low capacitance 3-plate MIM capacitor structure to provide protection for associated transistors. It has been discovered in association with the present disclosure that the addition of an enhanced total capacitance can translate to improved device performance.

In accordance with one or more embodiments of the present disclosure, total MIM cap density is increased by use of a scalable and configurable parallel plate capacitor layering scheme where the total number of electrode plates/capacitors in parallel increase from 3 to 4 or 5 in total. Embodiments can be implemented to provide a low-risk methodology to achieve significant MIM capacitance increases, which results in significant performance increases though both material development and integrated stack additions. In one embodiment, the combination results in a greater than 500% capacitance increase and a greater than 1 GHz improvement in equivalent transistor performance.

Embodiments can be implemented to significantly increases (5×, or even higher) the capacitance per unit of die area by increasing the effective capacitor area. This can be achieved through the addition of MIM capacitors which can be configured in multiple arrangements to tailor the final capacitance of the device depending on the need. Embodiments can include increased total capacitance (5×) by increasing the total number of plates (e.g., previous technology relied on a 3-plate MIM configuration where 2 high-k dielectric layers were used in parallel alternating with the three plates to supply the total MIM capacitance). In embodiments described herein, one or two (or even more) additional electrode/capacitor pairs are added to the stack in parallel. This approach can be implemented to allow for a total capacitance increase of, e.g., 5× in a same footprint as previous technologies.

Figure 12:
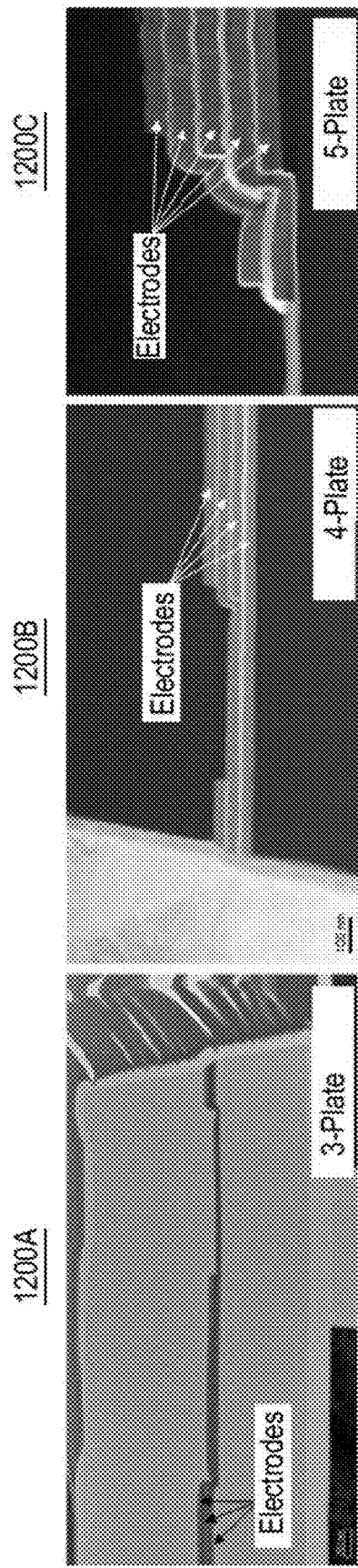
FIG. 12 shows comparative cross-sections of 3-plate versus 4 or 5-plate MIM capacitor stacks, in accordance with an embodiment of the present disclosure.

FIG. 12 shows comparative cross-sections of 3-plate versus 4 or 5-plate MIM capacitor stacks, in accordance with an embodiment of the present disclosure. In FIG. 12, cross-sections of the 3-plate MIM 1200A and the 4-plate MIM 1200B and 5-plate MIM 1200C capacitors are included. The variability plot of FIG. 13A, described below, depicts the total capacitance increased achieved through the addition of 2 additional plates in parallel.

With reference to the 4-plate capacitor 1200B of FIG. 12, in accordance with an embodiment of the present disclosure, a metal-insulator-metal (MIM) capacitor includes a first electrode plate, and a first capacitor dielectric on the first electrode plate. A second electrode plate is on the first capacitor dielectric and has a portion over and parallel with the first electrode plate, and a second capacitor dielectric is on the second electrode plate. A third electrode plate is on the second capacitor dielectric and has a portion over and parallel with the second electrode plate, and a third capacitor dielectric is on the third electrode plate. A fourth electrode plate is on the third capacitor dielectric and has a portion over and parallel with the third electrode plate.

With reference to the 5-plate capacitor 1200C of FIG. 12, in accordance with an embodiment of the present disclosure, in addition to the above, a metal-insulator-metal (MIM) capacitor further includes a fourth capacitor dielectric on the fourth electrode plate, and a fifth electrode plate on the fourth capacitor dielectric, the fifth electrode plate having a portion over and parallel with the fourth electrode plate.

In an embodiment, the first, second and third capacitor dielectrics (and, for a 5-plate, the fourth capacitor dielectric) include a high-k material. For example, in one embodiment, one or more of the capacitor dielectrics are composed of a STO material system, such as described above. In one embodiment, the capacitor dielectrics are composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In one embodiment, the first, second, third and fourth electrode plates (and, for a 5-plate, the fifth electrode plate) are composed of a metal layer such as, but not limited to, metal nitrides (TiN or TaN), metal carbides, metal silicides, metal aluminides, hafnium, zirconium, titanium, tantalum, aluminum, ruthenium, palladium, platinum, cobalt, nickel or conductive metal oxides.

In one embodiment, the first, second, third and fourth electrode plates (and, for a 5-plate, the fifth electrode plate) are included in a single dielectric layer, such as a low-k dielectric layer. In one such embodiment, the single dielectric layer is included in a back-end-of-line (BEOL) metallization structure. The BEOL metallization structure can be above a plurality of integrated circuit devices.

According to some embodiments, tailoring total capacitance is based on final use demand. Previous MIM structures utilized 2 different voltage potentials and a common ground. A 3-plate MIM electrode configuration uses individual plates to supply the Ground (GND), High Voltage (HV), and Low Voltage (LV) biases in parallel. In embodiments described herein, additional MIM plates are tied in parallel to either a GND or a specific voltage supply to provide either additional low or high voltage capable capacitance. This can offer enhanced flexibility of a final device based upon the use case for a particular implementation.

Figure 13A:
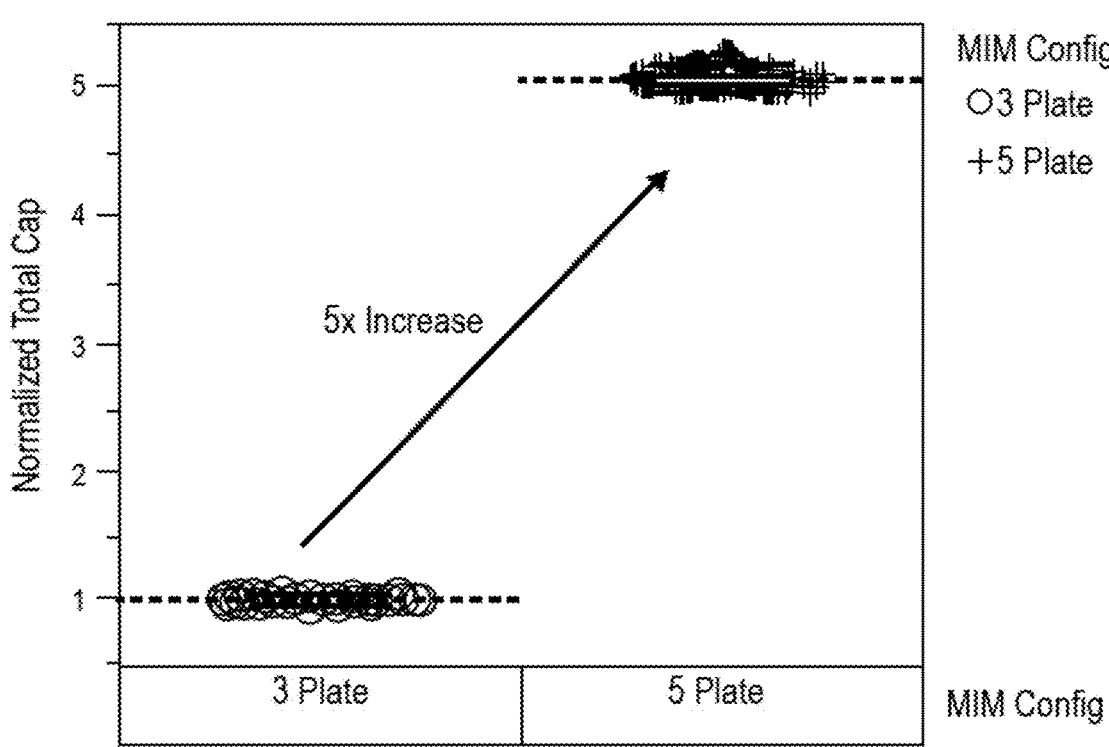
FIG. 13A includes a variability chart exhibiting the 5× normalized capacitance increase between 3 and 5-plate MIM, in accordance with an embodiment of the present disclosure.

FIG. 13A includes a variability chart 1300 exhibiting a 5× normalized capacitance increase between 3 and 5-plate MIM, in accordance with an embodiment of the present disclosure.

Figure 13B:
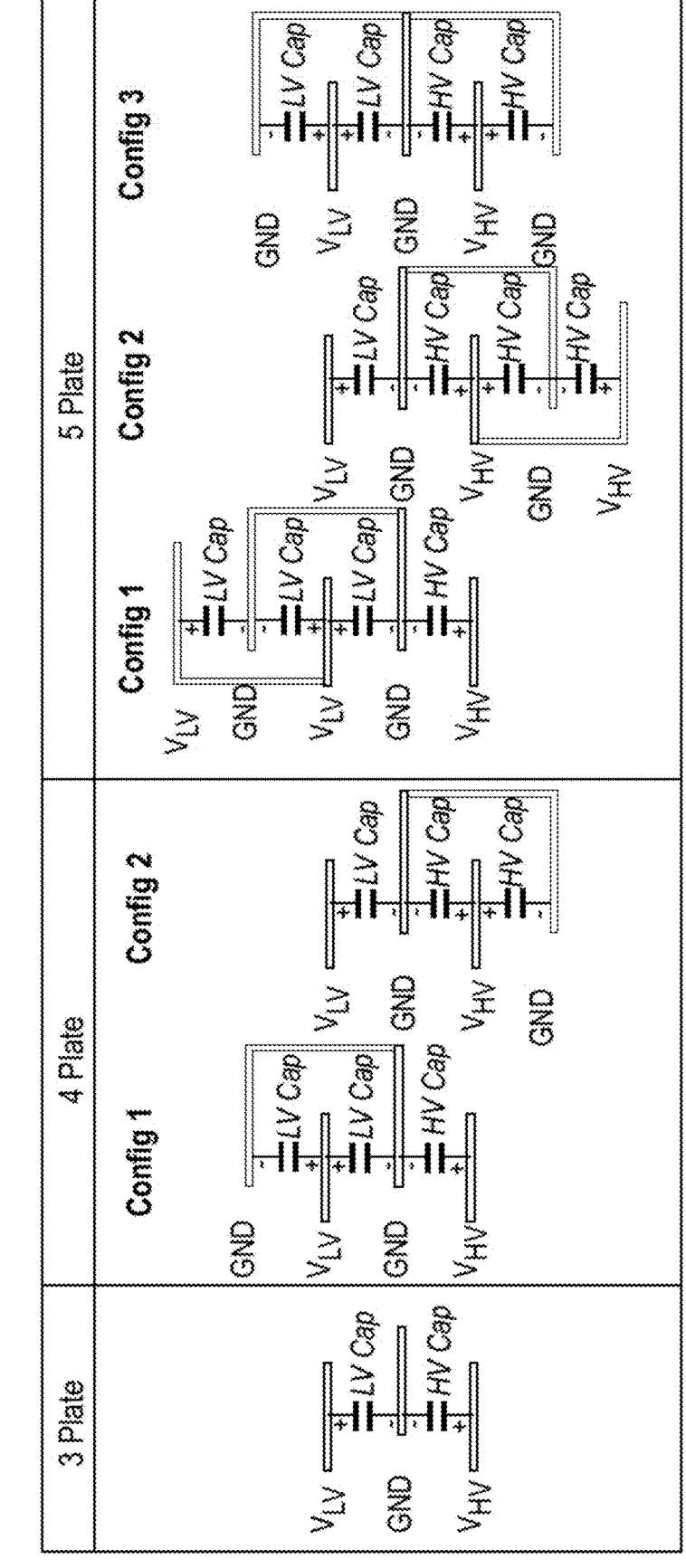
FIG. 13B is a schematic which compares the previous 3-plate MIM versus the various possible configurations using 4 and 5-plate MIM schemes, in accordance with an embodiment of the present disclosure.
Figure 13C:
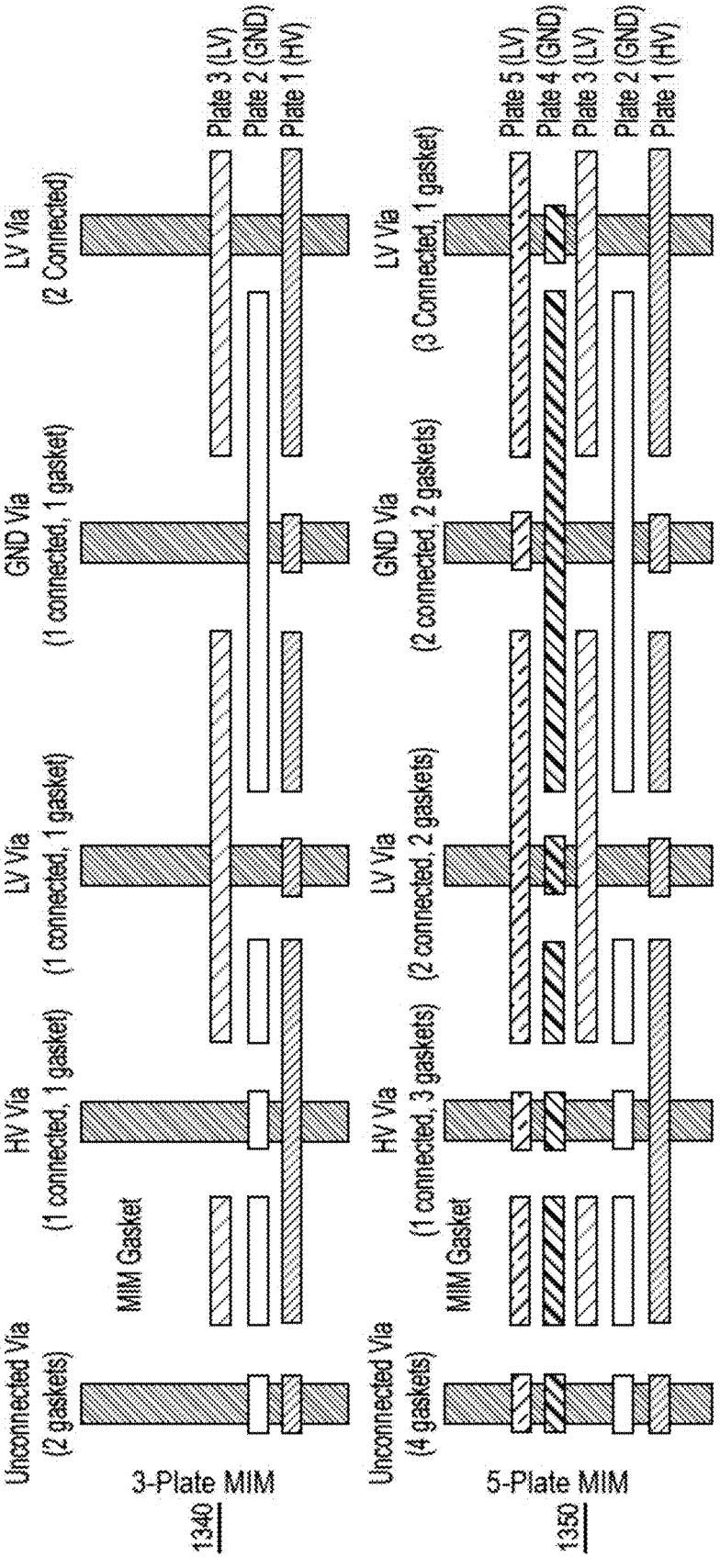
FIG. 13C is a schematic of a Via connection to MIM electrode plate in the 3-plate MIM in comparison to a 5-plate MIM, in accordance with an embodiment of the present disclosure.

FIG. 13B is a schematic 1320 which compares a 3-plate MIM versus various possible configurations using a 4 or 5-plate MIM schemes, in accordance with an embodiment of According to some embodiments, via gasketing and additional plate layer synthesis is implemented to enable 5-plate MIM fabrication. MIM capacitors can be wired in a variety of configurations where one or multiple plates can be connected to a single via for the circuit connections. Such an implementation can be advantageous for the integrated process yield to have an identical etch stack for each via regardless of the designed capacitor plate connections. In one or more embodiments of the present disclosure, each via has synthesized dummy plate features, called "gaskets," added to supplement the designed connection scheme such that all vias will have an identical etch stack. FIG. 13C details the gasketing schemes required to enable a 5-plate MIM configuration where every via passes through 4 electrode plates. Table 1, provided below also details the 5-plate MIM synthesis flow for both electrode connections and gasketing. It is to be appreciated that this approach can be applied to add additional plates beyond what is shown in the present example.

FIG. 13C is a schematic of a Via connection to MIM electrode plate in a 3-plate MIM 1340 in comparison to a 5-plate MIM 1350, in accordance with an embodiment of the present disclosure. The 3-plate MIM 1340 includes an unconnected via having two gaskets, an HV via having one connected and one gasket, an LV via having one connected and one gasket, a ground via having one connected and one gasket, and an LV via having two connected. The 5-plate MIM 1350 includes an unconnected via having four gaskets, an HV via having one connected and three gaskets, an LV via having two connected and two gaskets, a ground via having two connected and two gaskets, and an LV via having three connected and one gasket. In both cases, every via etches through same number of MIM plates.

Table 1 details possible electrode plate configurations which can be found in a 5 plate MIM scheme.

TABLE 1

| Drawn Capacitor | Bias | TVO Drawn Connection | Synthesis Connection | Gasketing | Via Etch (Total Plates) |
|---|---|---|---|---|---|
| Plate1/2 | GND | Plate2 + Plate3 | Plate4 + Plate5 | None | 4 |
| | + | Plate1 | None | Plate2 + Plate4 + Plate5 | 4 |
| Plate2/3 | + | Plate3 | Plate5 | Plate1 + Plate4 | 4 |
| | GND | Plate1 + Plate2 | Plate4 | Plate5 | 4 |
| Plate1/2/3 | + | Plate1 + Plate3 | Plate5 | Plate4 | 4 |
| | GND | Plate2 | Plate4 | Plate1 + Plate5 | 4 |
| No Plates | N/A | None | None | Plate1 + Plate2 + Plate4 + Plate5 | 4 | the present disclosure. FIG. 13B shows a previous technology configuration in comparison to several possible configurations which can be utilized in this scheme. For the 3 Plate structure, a single configuration includes an LV capacitor above an HV capacitor. For the 4 Plate structure, a first configuration (Config 1) includes a first LV capacitor above a second LV capacitor above an HV capacitor. A second configuration (Config 2) includes an LV capacitor above a first HV capacitor above a second HV capacitor. For the 5 Plate structure, a first configuration (Config 1) includes a first LV capacitor above a second LV capacitor above a third LV capacitor above an HV capacitor. A second configuration (Config 2) includes an LV capacitor above a first HV capacitor above a second HV capacitor above a third HV capacitor. A third configuration (Config 3) includes a first LV capacitor above a second LV capacitor above a first HV capacitor above a second HV capacitor.

Figure 13D:
FIG. 13D is a plot which demonstrates the effective product frequency improvement when adding total MIM capacitance, in accordance with an embodiment of the present disclosure.
Figure 13D:
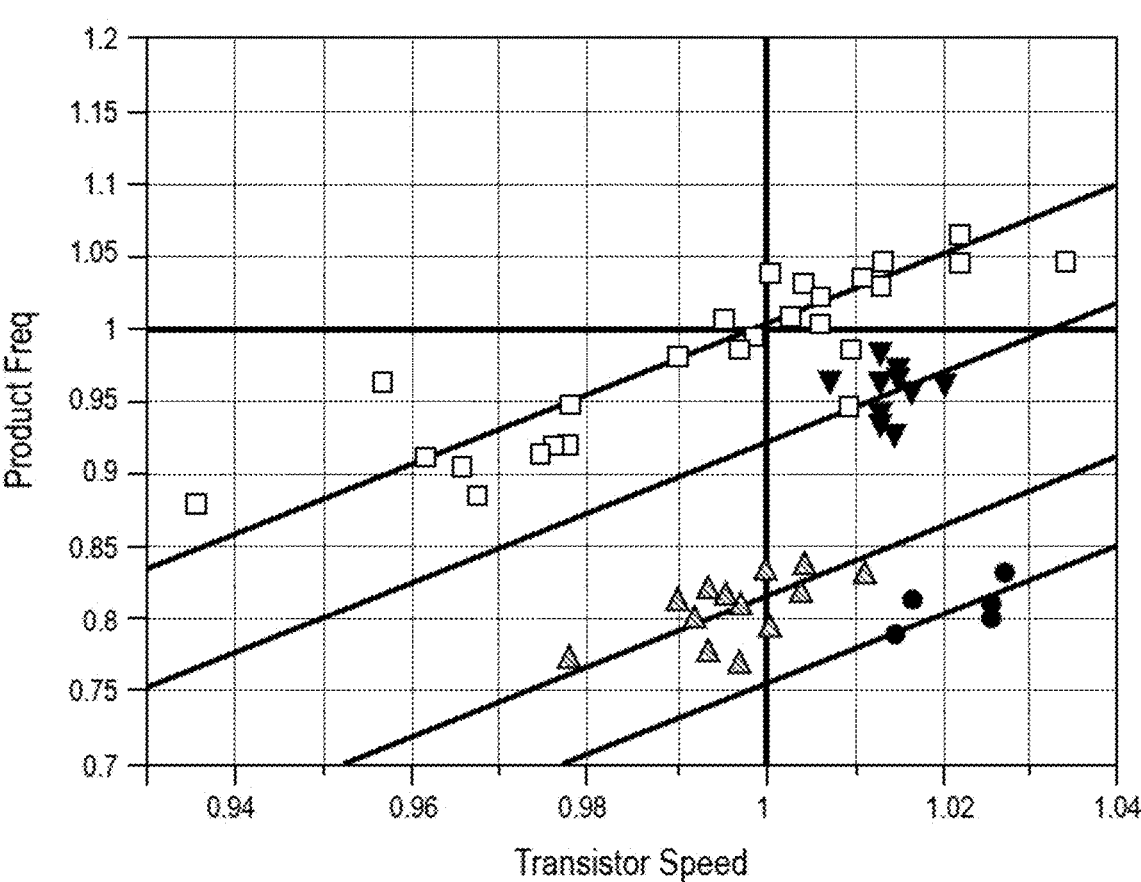

In an embodiment, the total MIM capacitance effect on final device performance was explored experimentally, as shown in FIG. 13D. FIG. 13D is a plot 1360 which demonstrates the effective product frequency improvement when adding total MIM capacitance, in accordance with an embodiment of the present disclosure. The data was collected experimentally. By increasing the total MIM capacitance by over 3×, the product frequency is increased by approximately 20%. This illustrates the benefit which a MIM architecture with a 5× increased total MIM capacitance.

In another aspect, back-end-of-line (BEOL) layers of integrated circuits commonly include electrically conductive microelectronic structures, which are known in the art as vias, to electrically connect metal lines or other interconnects above the vias to metal lines or other interconnects below the vias. In accordance with one or more embodiments of the present disclosure, a metal insulator metal (MIM) capacitor such as described above can be included a BEOL structure of an integrated circuit.

Figure 14:
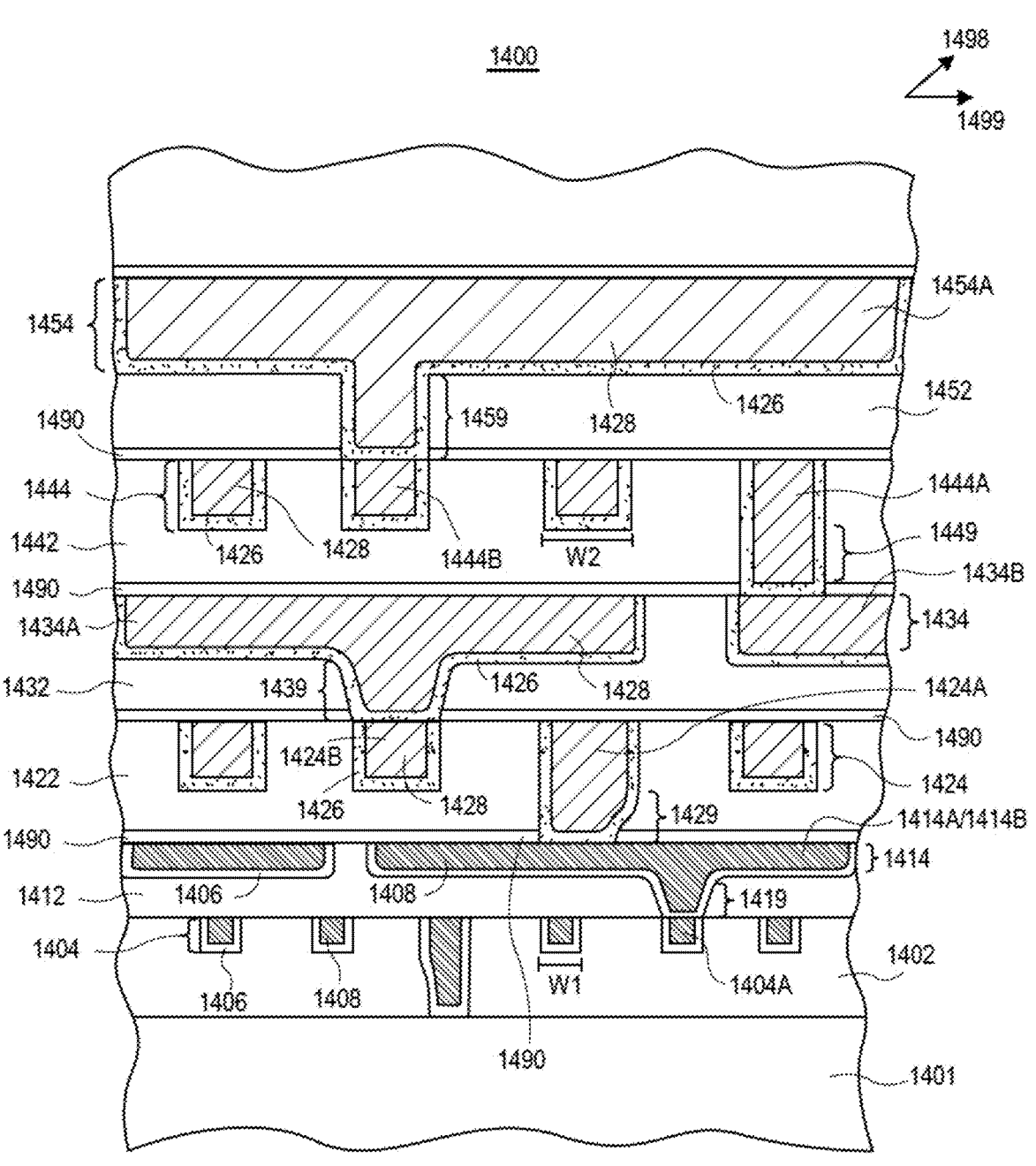
FIG. 14 illustrates a cross-sectional view of an integrated circuit structure having four metallization layers with a metal line composition and pitch above two metallization layers with a differing metal line composition and smaller pitch, in accordance with an embodiment of the present disclosure.

As an exemplary but non-limiting BEOL structure, FIG. 14 illustrates a cross-sectional view of an integrated circuit structure having four metallization layers with a metal line composition and pitch above two metallization layers with a differing metal line composition and smaller pitch, in accordance with an embodiment of the present disclosure. It is to be appreciated that a metal insulator metal (MIM) capacitor according to embodiments described above may be integrated into one or more layers of the integrated circuit structure described below in association with FIG. 14.

Referring to FIG. 14, an integrated circuit structure 1400 includes a first plurality of conductive interconnect lines 1404 in and spaced apart by a first inter-layer dielectric (ILD) layer 1402 above a substrate 1401. Individual ones of the first plurality of conductive interconnect lines 1404 include a first conductive barrier material 1406 along side-walls and a bottom of a first conductive fill material 1408. Individual ones of the first plurality of conductive interconnect lines 1404 are along a first direction 1498 (e.g., into and out of the page).

A second plurality of conductive interconnect lines 1414 is in and spaced apart by a second ILD layer 1412 above the first ILD layer 1402. Individual ones of the second plurality of conductive interconnect lines 1414 include the first conductive barrier material 1406 along sidewalls and a bottom of the first conductive fill material 1408. Individual ones of the second plurality of conductive interconnect lines 1414 are along a second direction 1499 orthogonal to the first direction 1498.

A third plurality of conductive interconnect lines 1424 is in and spaced apart by a third ILD layer 1422 above the second ILD layer 1412. Individual ones of the third plurality of conductive interconnect lines 1424 include a second conductive barrier material 1426 along sidewalls and a bottom of a second conductive fill material 1428. The second conductive fill material 1428 is different in composition from the first conductive fill material 1408. Individual ones of the third plurality of conductive interconnect lines 1424 are along the first direction 1498.

A fourth plurality of conductive interconnect lines 1434 is in and spaced apart by a fourth ILD layer 1432 above the third ILD layer 1422. Individual ones of the fourth plurality of conductive interconnect lines 1434 include the second conductive barrier material 1426 along sidewalls and a bottom of the second conductive fill material 1428. Individual ones of the fourth plurality of conductive interconnect lines 1434 are along the second direction 1499.

A fifth plurality of conductive interconnect lines 1444 is in and spaced apart by a fifth ILD layer 1442 above the fourth ILD layer 1432. Individual ones of the fifth plurality of conductive interconnect lines 1444 include the second conductive barrier material 1426 along sidewalls and a bottom of the second conductive fill material 1428. Individual ones of the fifth plurality of conductive interconnect lines 1444 are along the first direction 1498.

A sixth plurality of conductive interconnect lines 1454 is in and spaced apart by a sixth ILD layer 1452 above the fifth ILD layer 1442. Individual ones of the sixth plurality of conductive interconnect lines 1454 include the second conductive barrier material 1426 along sidewalls and a bottom of the second conductive fill material 1428. Individual ones of the sixth plurality of conductive interconnect lines 1454 are along the second direction 1499.

In an embodiment, the second conductive fill material 1428 consists essentially of copper, and the first conductive fill material 1408 consists essentially of cobalt. In an embodiment, the first conductive fill material 1408 includes copper having a first concentration of a dopant impurity atom, and the second conductive fill material 1428 includes copper having a second concentration of the dopant impurity atom, the second concentration of the dopant impurity atom less than the first concentration of the dopant impurity atom.

In an embodiment, the first conductive barrier material 1406 is different in composition from the second conductive barrier material 1426. In another embodiment, the first conductive barrier material 1406 and the second conductive barrier material 1426 have the same composition.

In an embodiment, a first conductive via 1419 is on and electrically coupled to an individual one 1404A of the first plurality of conductive interconnect lines 1404. An individual one 1414A of the second plurality of conductive interconnect lines 1414 is on and electrically coupled to the first conductive via 1419.

A second conductive via 1429 is on and electrically coupled to an individual one 1414B of the second plurality of conductive interconnect lines 1414. An individual one 1424A of the third plurality of conductive interconnect lines 1424 is on and electrically coupled to the second conductive via 1429.

A third conductive via 1439 is on and electrically coupled to an individual one 1424B of the third plurality of conductive interconnect lines 1424. An individual one 1434A of the fourth plurality of conductive interconnect lines 1434 is on and electrically coupled to the third conductive via 1439.

A fourth conductive via 1449 is on and electrically coupled to an individual one 1434B of the fourth plurality of conductive interconnect lines 1434. An individual one 1444A of the fifth plurality of conductive interconnect lines 1444 is on and electrically coupled to the fourth conductive via 1449.

A fifth conductive via 1459 is on and electrically coupled to an individual one 1444B of the fifth plurality of conductive interconnect lines 1444. An individual one 1454A of the sixth plurality of conductive interconnect lines 1454 is on and electrically coupled to the fifth conductive via 1459.

In one embodiment, the first conductive via 1419 includes the first conductive barrier material 1406 along sidewalls and a bottom of the first conductive fill material 1408. The second 1429, third 1439, fourth 1449 and fifth 1459 conductive vias include the second conductive barrier material 1426 along sidewalls and a bottom of the second conductive fill material 1428.

In an embodiment, the first 1402, second 1412, third 1422, fourth 1432, fifth 1442 and sixth 1452 ILD layers are separated from one another by a corresponding etch-stop layer 1490 between adjacent ILD layers. In an embodiment, the first 1402, second 1412, third 1422, fourth 1432, fifth 1442 and sixth 1452 ILD layers include silicon, carbon and oxygen.

In an embodiment, individual ones of the first 1404 and second 1414 pluralities of conductive interconnect lines have a first width (W1). Individual ones of the third 1424, fourth 1434, fifth 1444 and sixth 1454 pluralities of conductive interconnect lines have a second width (W2) greater than the first width (W1).

It is to be appreciated that the layers and materials described above in association with back-end-of-line (BEOL) structures and processing may be formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted may be fabricated on underlying lower level interconnect layers.

Although the preceding methods of fabricating a metallization layer, or portions of a metallization layer, of a BEOL metallization layer are described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed or both.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers may be formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 15:
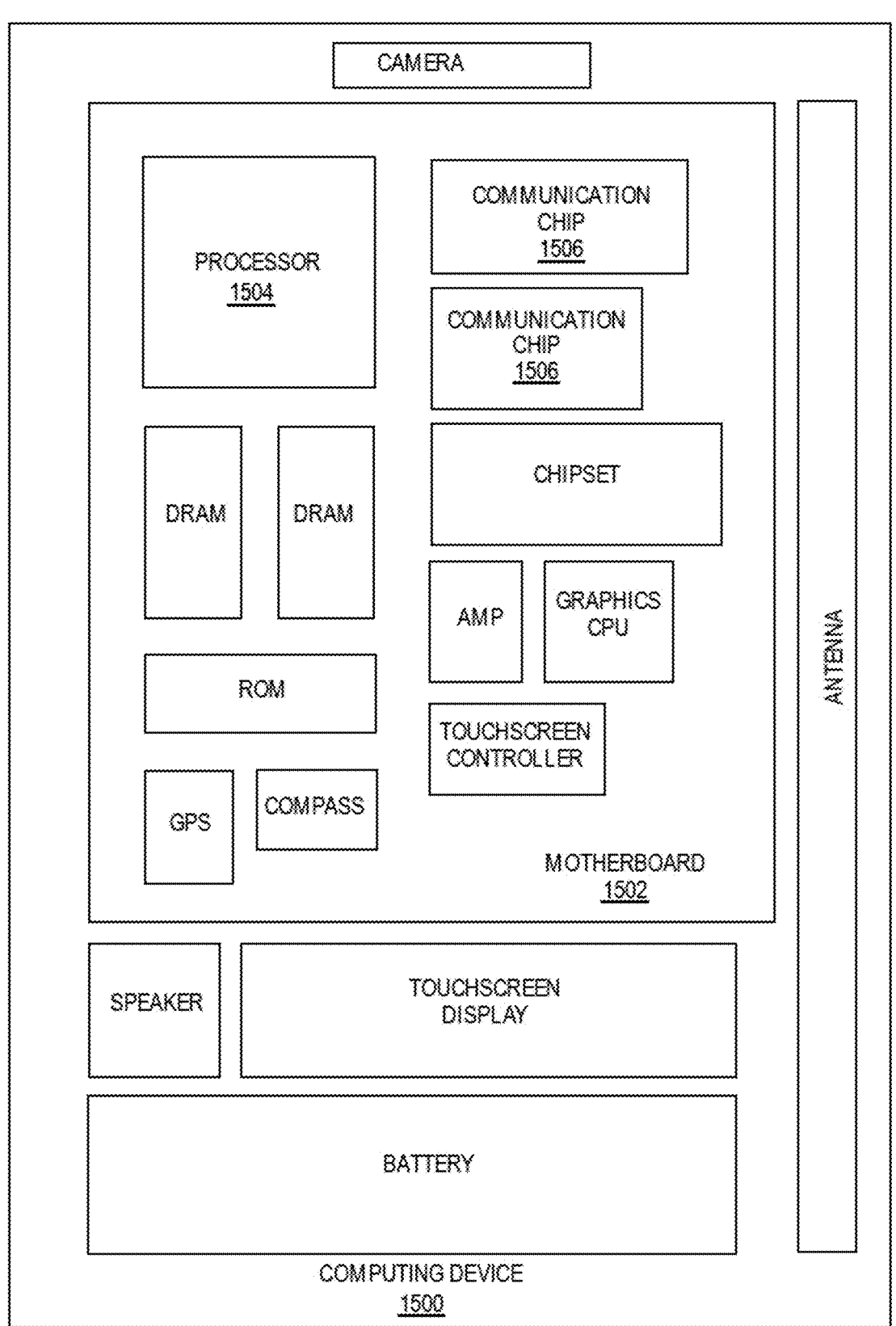
FIG. 15 illustrates a computing device in accordance with one implementation of the disclosure.

FIG. 15 illustrates a computing device 1500 in accordance with one implementation of the disclosure. The computing device 1500 houses a board 1502. The board 1502 may include a number of components, including but not limited to a processor 1504 and at least one communication chip 1506. The processor 1504 is physically and electrically coupled to the board 1502. In some implementations the at least one communication chip 1506 is also physically and electrically coupled to the board 1502. In further implementations, the communication chip 1506 is part of the processor 1504.

Depending on its applications, computing device 1500 may include other components that may or may not be physically and electrically coupled to the board 1502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1506 enables wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1500 may include a plurality of communication chips 1506. For instance, a first communication chip 1506 may be dedicated to shorter range wireless communications such as Wi-Fi and Bluetooth and a second communication chip 1506 may be dedicated to longer range wireless communications such as GPS, EDGE, GPRS, CDMA, WiMAX, LTE, Ev-DO, and others.

The processor 1504 of the computing device 1500 includes an integrated circuit die packaged within the processor 1504. In some implementations of embodiments of the disclosure, the integrated circuit die of the processor includes one or more structures, such as a metal insulator metal (MIM) capacitor built in accordance with implementations of the disclosure. The term "processor" may refer to any device or portion of a device that processes electronic data from registers or memory to transform that electronic data, or both, into other electronic data that may be stored in registers or memory, or both.

The communication chip 1506 also includes an integrated circuit die packaged within the communication chip 1506. In accordance with another implementation of the disclosure, the integrated circuit die of the communication chip has a metal insulator metal (MIM) capacitor built in accordance with implementations of the disclosure.

In further implementations, another component housed within the computing device 1500 may contain an integrated circuit die having a metal insulator metal (MIM) capacitor built in accordance with implementations of embodiments of the disclosure.

In various embodiments, the computing device 1500 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 1500 may be any other electronic device that processes data.

Figure 16:
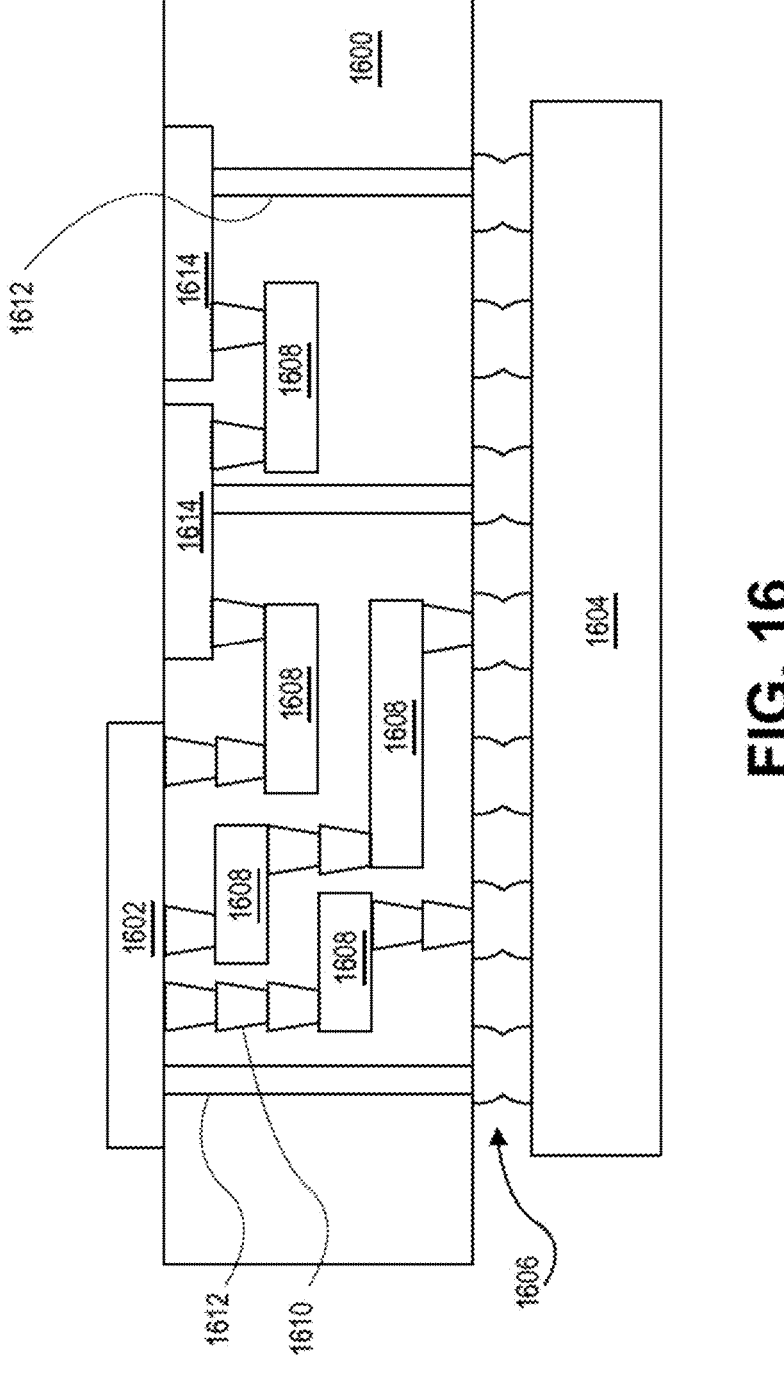
FIG. 16 illustrates an interposer that includes one or more embodiments of the disclosure.

FIG. 16 illustrates an interposer 1600 that includes one or more embodiments of the disclosure. The interposer 1600 is an intervening substrate used to bridge a first substrate 1602 to a second substrate 1604. The first substrate 1602 may be, for instance, an integrated circuit die. The second substrate 1604 may be, for instance, a memory module, a computer motherboard, or another integrated circuit die. Generally, the purpose of an interposer 1600 is to spread a connection to a wider pitch or to reroute a connection to a different connection. For example, an interposer 1600 may couple an integrated circuit die to a ball grid array (BGA) 1606 that can subsequently be coupled to the second substrate 1604. In some embodiments, the first and second substrates 1602/1604 are attached to opposing sides of the interposer 1600. In other embodiments, the first and second substrates 1602/1604 are attached to the same side of the interposer 1600. And, in further embodiments, three or more substrates are interconnected by way of the interposer 1600.

The interposer 1600 may be formed of an epoxy resin, a fiberglass-reinforced epoxy resin, a ceramic material, or a polymer material such as polyimide. In further implementations, the interposer 1600 may be formed of alternate rigid or flexible materials that may include the same materials described above for use in a semiconductor substrate, such as silicon, germanium, and other group III-V and group IV materials.

The interposer 1600 may include metal interconnects 1608 and vias 1610, including but not limited to through-silicon vias (TSVs) 1612. The interposer 1600 may further include embedded devices 1614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1600. In accordance with embodiments of the disclosure, apparatuses or processes disclosed herein may be used in the fabrication of interposer 1600 or in the fabrication of components included in the interposer 1600.

Figure 17:
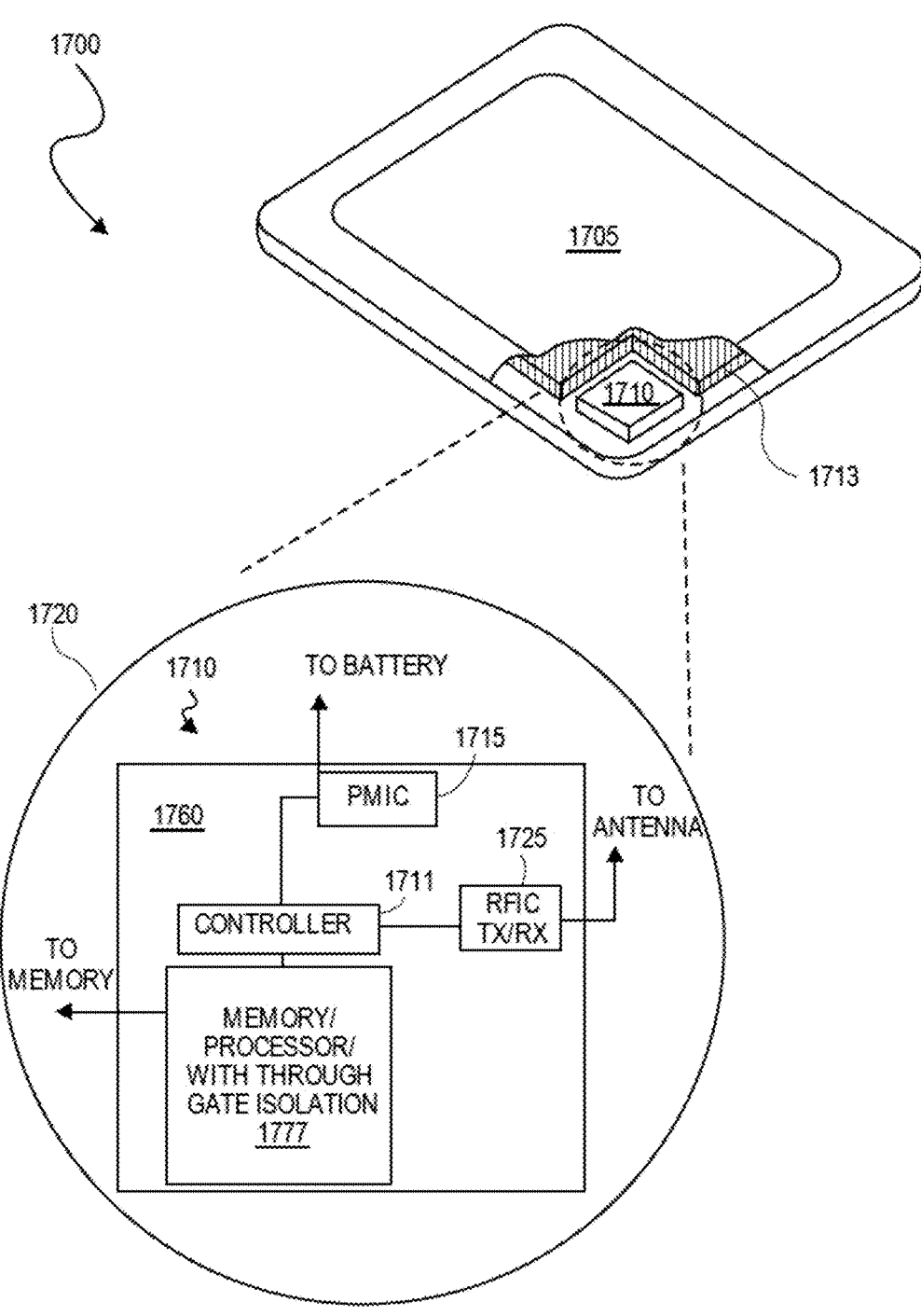
FIG. 17 is an isometric view of a mobile computing platform employing an IC fabricated according to one or more processes described herein or including one or more features described herein, in accordance with an embodiment of the present disclosure.

FIG. 17 is an isometric view of a mobile computing platform 1700 employing an integrated circuit (IC) fabricated according to one or more processes described herein or including one or more features described herein, in accordance with an embodiment of the present disclosure.

The mobile computing platform 1700 may be any portable device configured for each of electronic data display, electronic data processing, and wireless electronic data transmission. For example, mobile computing platform 1700 may be any of a tablet, a smart phone, laptop computer, etc. and includes a display screen 1705 which in the exemplary embodiment is a touchscreen (capacitive, inductive, resistive, etc.), a chip-level (SoC) or package-level integrated system 1710, and a battery 1713. As illustrated, the greater the level of integration in the system 1710 enabled by higher transistor packing density, the greater the portion of the mobile computing platform 1700 that may be occupied by the battery 1713 or non-volatile storage, such as a solid state drive, or the greater the transistor gate count for improved platform functionality. Similarly, the greater the carrier mobility of each transistor in the system 1710, the greater the functionality. As such, techniques described herein may enable performance and form factor improvements in the mobile computing platform 1700.

The integrated system 1710 is further illustrated in the expanded view 1720. In the exemplary embodiment, packaged device 1777 includes at least one memory chip (e.g., RAM), or at least one processor chip (e.g., a multi-core microprocessor and/or graphics processor) fabricated according to one or more processes described herein or including one or more features described herein. The packaged device 1777 is further coupled to the board 1760 along with one or more of a power management integrated circuit (PMIC) 1715, RF (wireless) integrated circuit (RFIC) 1725 including a wideband RF (wireless) transmitter and/or receiver (e.g., including a digital baseband and an analog front end module further includes a power amplifier on a transmit path and a low noise amplifier on a receive path), and a controller thereof 1711. Functionally, the PMIC 1715 performs battery power regulation, DC-to-DC conversion, etc., and so has an input coupled to the battery 1713 and with an output providing a current supply to all the other functional modules. As further illustrated, in the exemplary embodiment, the RFIC 1725 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, and beyond. In alternative implementations, each of these board-level modules may be integrated onto separate ICs coupled to the package substrate of the packaged device 1777 or within a single IC (SoC) coupled to the package substrate of the packaged device 1777.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 18:
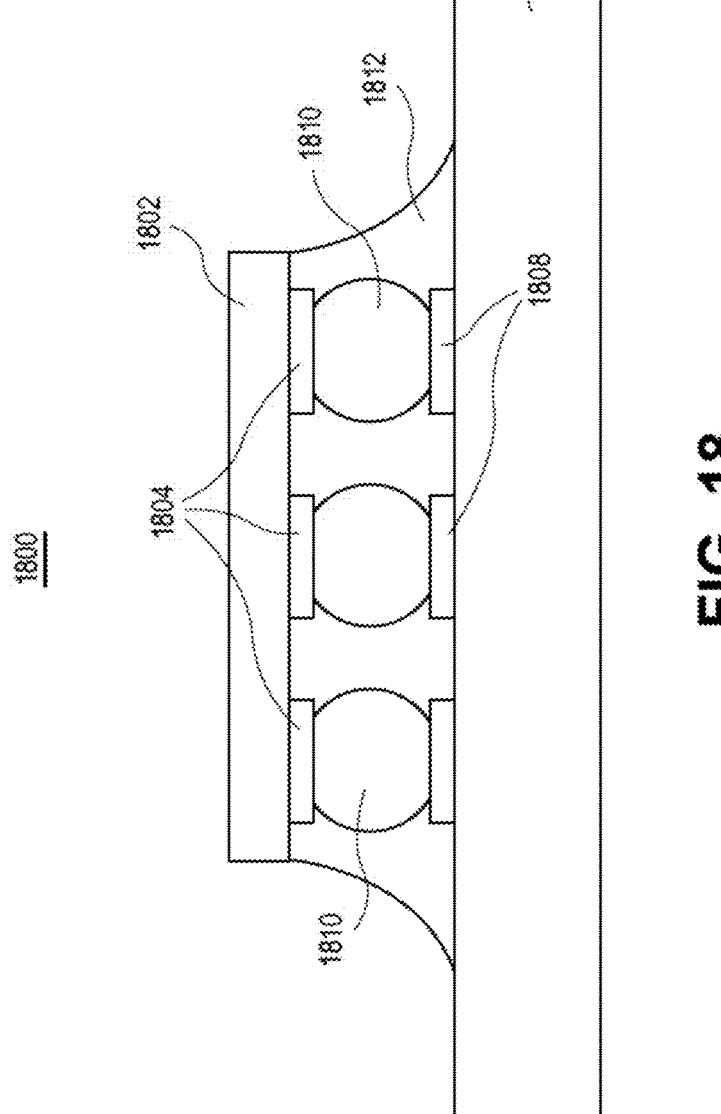
FIG. 18 illustrates a cross-sectional view of a flip-chip mounted die, in accordance with an embodiment of the present disclosure.

FIG. 18 illustrates a cross-sectional view of a flip-chip mounted die, in accordance with an embodiment of the present disclosure.

Referring to FIG. 18, an apparatus 1800 includes a die 1802 such as an integrated circuit (IC) fabricated according to one or more processes described herein or including one or more features described herein, in accordance with an embodiment of the present disclosure. The die 1802 includes metallized pads 1804 thereon. A package substrate 1806, such as a ceramic or organic substrate, includes connections 1808 thereon. The die 1802 and package substrate 1806 are electrically connected by solder balls 1810 coupled to the metallized pads 1804 and the connections 1808. An underfill material 1812 surrounds the solder balls 1810.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include metal insulator metal (MIM) capacitors.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: A metal-insulator-metal (MIM) capacitor includes a first electrode that includes a bottom region and a pair of vertical regions. First metal layers are outside the vertical regions and in contact with the vertical regions. An insulator is over the first electrode. A second electrode is over the insulator. A second metal layer is on a top surface of the second electrode.

Example embodiment 2: The MIM capacitor of example embodiment 1, wherein the first metal layers have a same composition as the first electrode.

Example embodiment 3: The MIM capacitor of example embodiment 1, wherein the first metal layers have a different composition than the first electrode.

Example embodiment 4: The MIM capacitor of example embodiment 1, 2 or 3, wherein the second metal layer has a same composition as the second electrode.

Example embodiment 5: The MIM capacitor of example embodiment 1, 2 or 3, wherein the second metal layer has a same composition as the second electrode.

Example embodiment 6: An integrated circuit structure includes a first capacitor having electrodes over and under a first insulator. A second capacitor is stacked on the first capacitor, the second capacitor having electrodes over and under a second insulator, wherein the first insulator and the second insulator include strontium, titanium, and oxygen. A third capacitor is stacked on the second capacitor, the third capacitor having electrodes over and under a third insulator, wherein the third insulator includes hafnium, aluminum, and oxygen.

Example embodiment 7: The integrated circuit structure of example embodiment 6, wherein the third insulator has a same thickness as the first insulator and as the second insulator.

Example embodiment 8: The integrated circuit structure of example embodiment 6, wherein the third insulator has a thickness less than a thickness of the first insulator and less than a thickness of the second insulator.

Example embodiment 9: The integrated circuit structure of example embodiment 6, 7 or 8, wherein the electrodes of the third capacitor have a composition different from a composition of the electrodes of the first and second capacitors.

Example embodiment 10: The integrated circuit structure of example embodiment 6, 7, 8 or 9, further including a fourth capacitor stacked on the third capacitor, the fourth capacitor having electrodes over and under a fourth insulator, where the fourth insulator includes strontium, titanium, and oxygen.

Example embodiment 11: A metal-insulator-metal (MIM) capacitor includes a first electrode. A first metal layer is over the first electrode, wherein portions of the first electrode extend along sides of the first metal layer and above an uppermost surface of the first metal layer. An insulator is over the first metal. A second electrode is over the insulator. A second metal layer is over the second electrode.

Example embodiment 12: The MIM capacitor of example embodiment 11, wherein portions of the second electrode extend along sides of the second metal layer and above an uppermost surface of the second metal layer.

Example embodiment 13: The MIM capacitor of example embodiment 11 or 12, wherein the portions of the first electrode extend above an uppermost surface of the second metal layer.

Example embodiment 14: The MIM capacitor of example embodiment 11, 12 or 13, wherein portions of the insulator extend above an uppermost surface of the second metal layer.

Example embodiment 15: The MIM capacitor of example embodiment 11, 12, 13 or 14, further including a third metal layer on an uppermost surface of the first electrode.

Example embodiment 16: A computing device includes a board, and a component coupled to the board. The component includes a metal-insulator-metal (MIM) capacitor including a first electrode that includes a bottom region and a pair of vertical regions. First metal layers are outside the vertical regions and in contact with the vertical regions. An insulator is over the first electrode. A second electrode is over the insulator. A second metal layer is on a top surface of the second electrode.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, further including a camera coupled to the board.

Example embodiment 20: The computing device of example embodiment 16, 17, 18 or 19, wherein the component is a packaged integrated circuit die.

What is claimed is:

1. A metal insulator metal (MIM) capacitor, comprising:
a first electrode that includes a bottom region and a pair of vertical regions, the bottom region coupling the vertical regions of the pair of vertical regions;
first metal layers outside the vertical regions and in contact with the vertical regions;
an insulator over the first electrode;
a second electrode over the insulator; and
a second metal layer on a top surface of the second electrode.

2. The MIM capacitor of claim 1, wherein the first metal layers have a same composition as the first electrode.

3. The MIM capacitor of claim 1, wherein the first metal layers have a different composition than the first electrode.

4. The MIM capacitor of claim 1, wherein the second metal layer has a same composition as the second electrode.

5. The MIM capacitor of claim 1, wherein the first metal layers have a different composition than the first electrode, and wherein the second metal layer has a same composition as the second electrode.

6. An integrated circuit structure comprising:
a first capacitor having electrodes over and under a first insulator;
a second capacitor stacked on the first capacitor, the second capacitor having electrodes over and under a second insulator, wherein the first insulator and the second insulator comprise strontium, titanium, and oxygen; and
a third capacitor stacked on the second capacitor, the third capacitor having electrodes over and under a third insulator, wherein the third insulator comprises hafnium, aluminum, and oxygen.

7. The integrated circuit structure of claim 6, wherein the third insulator has a same thickness as the first insulator and as the second insulator.

8. The integrated circuit structure of claim 6, wherein the third insulator has a thickness less than a thickness of the first insulator and less than a thickness of the second insulator.

9. The integrated circuit structure of claim 6, wherein the electrodes of the third capacitor have a composition different from a composition of the electrodes of the first and second capacitors.

10. The integrated circuit structure of claim 6, further comprising:
a fourth capacitor stacked on the third capacitor, the fourth capacitor having electrodes over and under a fourth insulator, wherein the fourth insulator comprises strontium, titanium, and oxygen.

11. A metal insulator metal (MIM) capacitor, comprising:
a first electrode;
a first metal layer over the first electrode, wherein portions of the first electrode extend along sides of the first metal layer and above an uppermost surface of the first metal layer;
an insulator over the first metal;
a second electrode over the insulator; and
a second metal layer over the second electrode.

12. The MIM capacitor of claim 11, wherein portions of the second electrode extend along sides of the second metal layer and above an uppermost surface of the second metal layer.

13. The MIM capacitor of claim 11, wherein the portions of the first electrode extend above an uppermost surface of the second metal layer.

14. The MIM capacitor of claim 11, wherein portions of the insulator extend above an uppermost surface of the second metal layer.

15. The MIM capacitor of claim 11, further comprising:
a third metal layer on an uppermost surface of the first electrode.

16. A computing device, comprising:
a board; and
a component coupled to the board, the component including a metal-insulator-metal (MIM) capacitor, comprising:
a first electrode that includes a bottom region and a pair of vertical regions, the bottom region coupling the vertical regions of the pair of vertical regions;
first metal layers outside the vertical regions and in contact with the vertical regions;

an insulator over the first electrode;
a second electrode over the insulator; and
a second metal layer on a top surface of the second electrode.

17. The computing device of claim 16, further comprising:
a memory coupled to the board.

18. The computing device of claim 16, further comprising:
a communication chip coupled to the board.

19. The computing device of claim 16, further comprising:
a camera coupled to the board.

20. The computing device of claim 16, wherein the component is a packaged integrated circuit die.

* * * * *